(12) United States Patent
Matsuda et al.

(10) Patent No.: US 8,060,848 B2
(45) Date of Patent: Nov. 15, 2011

(54) VERIFICATION SUPPORT APPARATUS, VERIFICATION SUPPORT METHOD, AND COMPUTER PRODUCT

(75) Inventors: Akio Matsuda, Kawasaki (JP); Ryosuke Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 366 days.

(21) Appl. No.: 12/495,408

(22) Filed: Jun. 30, 2009

(65) Prior Publication Data

US 2010/0083204 A1    Apr. 1, 2010

(30) Foreign Application Priority Data

Sep. 26, 2008  (JP) ................................. 2008-249098

(51) Int. Cl.
  *G06F 17/50*  (2006.01)
  *G06F 9/455*  (2006.01)
  *G06F 9/44*  (2006.01)
(52) U.S. Cl. .................... 716/106; 716/108; 717/132
(58) Field of Classification Search .................. 716/100, 716/103, 106, 108, 132, 134, 136; 717/106, 717/124, 131, 132
See application file for complete search history.

(56) References Cited

U.S. PATENT DOCUMENTS

| 5,691,911 | A * | 11/1997 | Gregory et al. | 716/104 |
|---|---|---|---|---|
| 6,324,678 | B1 * | 11/2001 | Dangelo et al. | 716/103 |
| 6,415,420 | B1 * | 7/2002 | Cheng et al. | 716/103 |
| 6,421,808 | B1 * | 7/2002 | McGeer et al. | 716/100 |
| 6,907,599 | B1 * | 6/2005 | Kashai et al. | 717/137 |
| 7,260,798 | B2 * | 8/2007 | Gupta et al. | 716/104 |
| 7,509,599 | B1 * | 3/2009 | Koelbl et al. | 716/103 |
| 7,769,569 | B2 * | 8/2010 | Stern | 703/2 |
| 2006/0155521 | A1 | 7/2006 | Iwashita | |
| 2006/0190861 | A1 | 8/2006 | Matsuura | |
| 2007/0168988 | A1 * | 7/2007 | Eisner et al. | 717/126 |
| 2007/0226666 | A1 * | 9/2007 | Ganai et al. | 716/5 |
| 2009/0327997 | A1 * | 12/2009 | Gulwani et al. | 717/110 |
| 2010/0064266 | A1 * | 3/2010 | Matsuda et al. | 716/4 |
| 2010/0251196 | A1 * | 9/2010 | Stern | 716/5 |
| 2010/0299656 | A1 * | 11/2010 | Shah et al. | 717/132 |
| 2010/0325608 | A1 * | 12/2010 | Radigan | 717/106 |

FOREIGN PATENT DOCUMENTS

JP    2006-190209 A    7/2006
JP    2006-201980 A    8/2006

OTHER PUBLICATIONS

Foster, Harry "Programming Code Metrics", Assertion-Based Design, 2nd Edition, 2004, p. 129-130.

* cited by examiner

*Primary Examiner* — Stacy Whitmore
(74) *Attorney, Agent, or Firm* — Fujitsu Patent Center

(57) ABSTRACT

A computer-readable recording medium stores therein a verification support program that causes a computer to execute receiving a hardware description of a sequential circuit to be verified and a timing specification that indicates a timing constraint in the hardware description; converting the hardware description into a control flow graph that expresses a flow of control in the sequential circuit; indentifying, from the control flow graph and as a combination of conditional branch descriptions having a hierarchical relation, conditional branch descriptions that are connected in parallel; extracting, from among identified combinations of conditional branch descriptions, a combination having a potential to satisfy specified conditions; creating a simulation program that, at a timing satisfying the timing specification, causes the conditional branch descriptions included in the extracted combination to satisfy the specified conditions; and outputting, as assertion information of the sequential circuit, the simulation program created at the creating.

8 Claims, 22 Drawing Sheets

FIG.15

| | | cover STATEMENT | |
|---|---|---|---|
| | | APPLICABLE | NOT APPLICABLE |
| COMPARISON BETWEEN EXPECTED VALUE AND SIMULATION OUTPUT | AGREE | OPERATION AS INDICATED BY EXPECTED VALUE, INCLUSIVE OF PART AT WHICH MULTIPLE CONDITIONS ARE EFFECTIVE AT THE SAME TIME ·VERIFICATION SCENARIO SUFFICIENT | OPERATION AS INDICATED BY EXPECTED VALUE BUT PART AT WHICH MULTIPLE CONDITIONS ARE EFFECTIVE AT THE SAME TIME IS NOT VERIFIED ·VERIFICATION SCENARIO INSUFFICIENT |
| | NOT AGREE | BUG CAUSING OPERATION THAT IS NOT AS INDICATED BY EXPECTED VALUE | |

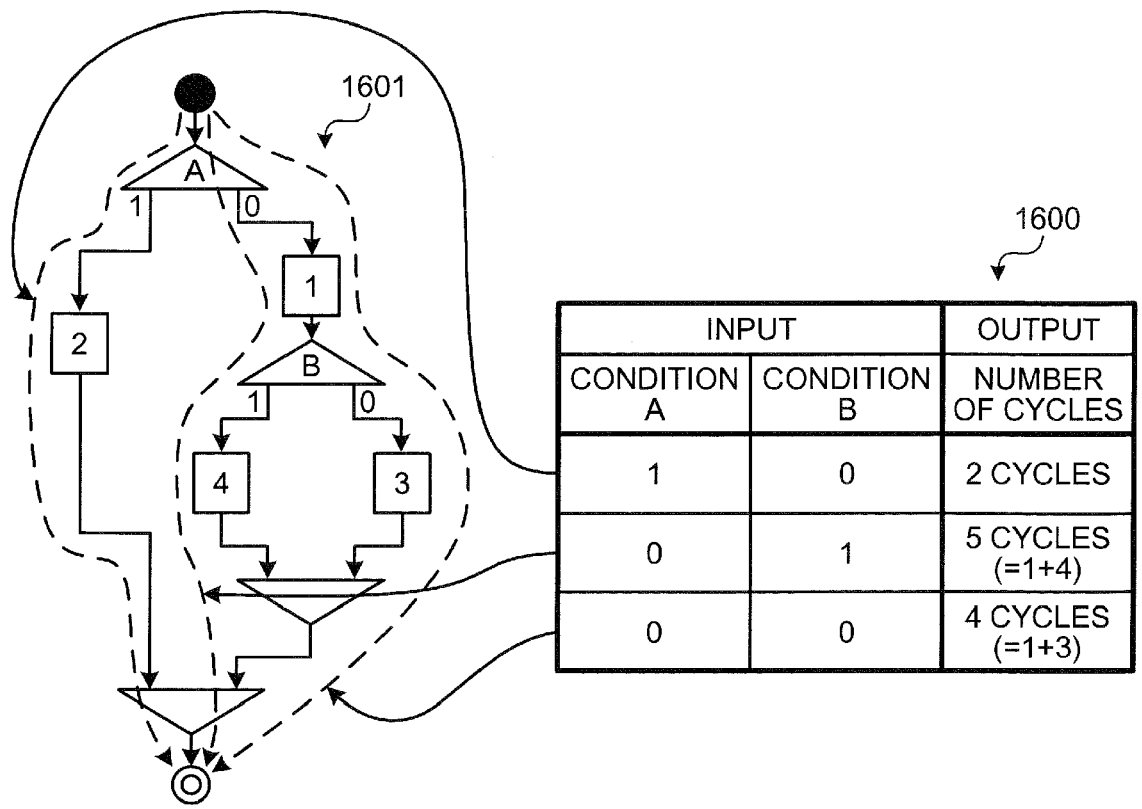

FIG.21

| INPUT | | OUTPUT | | DETERMINATION | | GENERAL DETERMINATION |
|---|---|---|---|---|---|---|
| CONDI-TION A | CONDI-TION B | SIMULA-TION OUTPUT | EXPECT-ED VALUE | COMPARISON BETWEEN EXPECTED VALUE AND SIMULATION OUTPUT | APPLICABILITY OF cover statement | |
| 1 | 0 | 3 CYCLES | | OUTPUT IS WITHIN 5 CYCLES; THUS, SPECIFICATION IS SATISFIED | (NOT APPLI-CABLE) | OPERATION AS INDICATED BY EXPECTED VALUE BUT PART IN WHICH MULTIPLE CONDITIONS ARE EFFECTIVE IS NOT VERIFIED ·VERIFICATION SCENARIO IS NOT SUFFICIENT |
| 0 | 1 | 5 CYCLES | OUTPUT WITHIN 5 CYCLES | | (NOT APPLI-CABLE) | |
| 1 | 0 | 3 CYCLES | | | (NOT APPLI-CABLE) | |
| | | | | | NOT APPLI-CABLE | |

2100

| INPUT INFORMATION | | | OUTPUT INFORMATION | |
|---|---|---|---|---|
| REQUEST | CONDITION A | CONDITION B | ack | DATA |
| 1 | 1 | 1 | 1 | OUTPUT WITHIN 5 CYCLES |
| 1 | 1 | 0 | | |
| 1 | 0 | 1 | | |
| 1 | 0 | 0 | | |
| 0 | d.c | d.c | 0 | - |

| PATH | VERIFICATION SCENARIO | | |
|---|---|---|---|
| | INPUT | | OUTPUT |
| | CONDITION A | CONDITION B | NUMBER OF CYCLES |
| a | 1 | 1 | 2 CYCLES |
| b | 1 | 0 | 2 CYCLES |
| c | 0 | 1 | 5 CYCLES (=1+4) |
| d | 0 | 0 | 4 CYCLES (=1+3) |

| PATH | CONDITION A | CONDITION B | NUMBER OF CYCLES | |
|---|---|---|---|---|
| | | | <CORRECT DESCRIPTION> | <INCORRECT DESCRIPTION> |
| a | 1 | 1 | 2 CYCLES | 6 CYCLES (=4+2) |
| b | 1 | 0 | 2 CYCLES | 3 CYCLES |
| c | 0 | 1 | 5 CYCLES (=1+4) | 5 CYCLES (=4+1) |
| d | 0 | 0 | 4 CYCLES (=1+3) | 3 CYCLES | it is assumed that a hardware specification is reflected without any error in the hardware description.

However, in the path coverage, it is assumed that the hardware description is described without errors based on the hardware specification. Therefore, if the verification scenario is created by extracting only the path in the CFG 2600, a verification oversight occurs concerning the timing constraints that are given as the hardware specification corresponding to the RTL description.

VERIFICATION SUPPORT APPARATUS, VERIFICATION SUPPORT METHOD, AND COMPUTER PRODUCT

CROSS REFERENCE TO RELATED APPLICATIONS

This application is based upon and claims the benefit of priority of the prior Japanese Patent Application No. 2008-249098, filed on Sep. 26, 2008, the entire contents of which are incorporated herein by reference.

FIELD

The embodiment discussed herein is related to circuit verification support.

BACKGROUND

Conventionally, when hardware (sequential circuit) that implements a desired function is designed, logic verification to check for omissions in the design is a fundamental process before moving to manufacture of actual hardware. Specifically, a verification scenario that suits the contents of the hardware design is created, and logic verification is performed using an output result obtained when the verification scenario is input.

Furthermore, verification coverage is obtained to objectively evaluate the verification that has been performed using the verification scenario created as described above. Verification coverage is information concerning an index that indicates the sufficiency of simulation patterns for a subject of verification. Specifically, if the population is all simulation patterns requiring verification, coverage obtained from a rate of the executed simulation patterns is provided as the verification coverage. In this case, verification accuracy is determined to be high if the verification coverage is high.

A problem with this technique concerns the method of extracting "all simulation patterns requiring verification", i.e., the population. Simulation patterns corresponding to the population are referred to as coverage standards. If patterns are extracted that are not effective practically for verification as coverage standards, the patterns do not necessarily contribute to improvement of actual verification efficiency even if the coverage of the simulation is high.

Therefore, methods called path coverage and code coverage in which patterns are comprehensively extracted according to specific standards are used nowadays. In path coverage, patterns to verify all paths causing state transitions in the register of a circuit under verification are extracted. Therefore, with the path coverage method, these patterns are the coverage standards. Code coverage is also called line coverage, and patterns are extracted to verify paths related to input and output of the register in which source codes corresponding to a circuit under verification are described. Further, in the code coverage, these patterns are the coverage standards. Such techniques are disclosed in, for example, Japanese Laid-Open Patent Publication Nos. 2006-190209 and 2006-201980, and "Assertion-Based Design" (2nd Edition) by Foster, Harry D., et al., "Programming Code metrics", pp. 129-130, 2004.

However, even if a verification scenario comprehensive of the coverage standards as described above is created and verification is performed using the verification scenario, a bug due to an omission of verification may occur when the sequential circuit is actually operated, even if the coverage standards described above are 100 in the verification scenario; a consequence originating in a verification oversight of timing constraints that are given as a hardware specification corresponding to register transistor logic (RTL) description.

FIG. 22 is a schematic diagram for explaining input/output information of a hardware unit. As depicted in FIG. 22, to a hardware unit 2200, a request (req) 2201, a condition A 2202, and a condition B 2203 are input as input information. Furthermore, data 2204 that indicates a result of processing by the hardware unit 2200 and an acknowledgement (ack) signal 2205 giving notification that data has been output normally from the hardware unit 2200 are output as output information. Moreover, as described above, the hardware unit 2200 is a sequential circuit. Therefore, as hardware specifications, constraints related to timing are included in addition to constraints related to the input/output information, as described above.

FIG. 23 is a chart of one example of hardware specifications. A chart 2300 indicates specifications for the hardware unit 2200. As depicted in the chart 2300, one specification is for the data 2204 corresponding to the condition A 2202 and the condition B 2203, which are input to the hardware unit 2200, to be output within five cycles, when the request 2201 is input ("1"). When the data 2204 is output from the hardware unit 2200, the ack signal 2205 giving notification of the output of the data 2204 is output. If the request 2201 is not input ("0"), neither the data 2204 nor the ack signal 2205 are output, and therefore, the condition A 2202 and the condition B 2203 do not affect the output regardless of values thereof (d.c: don't care).

FIG. 24 is a timing chart of an example of operation corresponding to the specifications of the hardware. When the request 2201 has been input ("high state") to the hardware unit 2200, according to the hardware description, determination of the condition A 2202 is started at the first clock start timing C0. After a predetermined number of cycles (in this example, it is assumed that the determination of the condition A 2202 takes one cycle), determination of the condition B 2203 is started at a following clock start timing C1. When the determination of the condition B 2203 is completed after a predetermined number of cycles (in this example, it is assumed that the determination of the condition B 2203 takes four cycles), the ack signal 2205 is output. Upon output of the data 2204 corresponding to this ack signal 2205, the input of the request 2201 is ended ("low state"). In the example depicted in FIG. 24, it takes five cycles from the input of the request 2201 to the output of the data 2204, thereby satisfying the timing specifications.

With the conventional verification coverage, in the path coverage standards, a verification scenario is created for each path corresponding to conditional branching for hardware that is designed based on the specifications as described above, thereby improving the verification accuracy. FIG. 25 is a chart of coverage of each verification scenario. FIG. 26 is a schematic diagram for explaining one example of a control flow graph (CFG) expressing a circuit to be verified. If a circuit to be verified is expressed as CFG 2600 depicted in FIG. 26, normally, a verification scenario as depicted in a chart 2500 is created. Numerals in blocks of the CFG 2600 indicate the number of cycles required for processing.

When a verification scenario 2510 of items b, c, and d is executed, all paths are covered as expressed by broken lines in FIG. 26. Therefore, even when a verification scenario 2520 of an item a is not used, or the verification scenario 2520 of the item a is not created, the path coverage standards have the coverage of 100.

If there is no error in the hardware description, it is possible to find a bug without omission by performing verification that satisfies the coverage standards as described above. However, when there is an error in the hardware description, oversight in verification can be caused when the specification is not satisfied, or the like.

A case where verification oversight is caused concerning a conditional branch is explained. FIG. 27 is a schematic diagram for explaining an example in which an error in a conditional branch is overlooked. For example, when a sequential circuit is designed that outputs a result of determination of the condition A 2202 and the condition B 2203 within five cycles according to a timing specification, correct description (CFG 2600) conforming to the timing specification may be changed to an incorrect description (CFG 2700) such as when a designer makes an error when attempting to make a correction.

FIG. 28 is a chart of the number of cycles corresponding to a conditional branch. As depicted in a chart 2800, according to an example of correct description, the data 2204 is output within five cycles through any conditional branch path. On the other hand, in an example of incorrect description, although the data 2204 can be output in the verification scenario 2810 for the items b, c, and d according to the specifications, it takes six cycles to output the data 2204 in the verification scenario 2820 for the item a. As a result, in the example of incorrect description, a bug occurs when both the conditions A and B are "1" (path 2701 depicted in FIG. 27). In other words, although the verification scenario 2820 of the item a is an effective verification scenario to detect a bug, there is a high possibility that the verification scenario 2820 of the item a is not created in the conventional coverage standards described above.

Moreover, when the line coverage described above is used as the coverage standards, verification of paths corresponding to the description of source code corresponding to a sequential circuit to be verified is a problem either in correct description or in incorrect description. Therefore, if the verification scenario 2810 of the items b, c, and d are created, the coverage becomes 100 coverage.

As described, in the conventional coverage standards, coverage concerning the conditional branch in a circuit to be verified may not be completely covered even if a verification scenario that achieves 100 coverage is created.

However, a technique to confirm coverage of conditional branches by a created verification scenario has not been provided. Therefore, incorrect description cannot be extracted as a problem when hardware description has been changed to incorrect description as explained with reference to FIG. 27, and there has been a problem that hardware design inclusive of a bug is provided.

SUMMARY

According to an aspect of an embodiment, computer-readable recording medium stores therein a verification support program that causes a computer to execute receiving a hardware description of a sequential circuit to be verified and a timing specification that indicates a timing constraint in the hardware description; converting the hardware description into a control flow graph that expresses a flow of control in the sequential circuit; indentifying, from the control flow graph and as a combination of conditional branch descriptions having a hierarchical relation, conditional branch descriptions that are connected in parallel; extracting, from among combinations of conditional branch descriptions identified at the identifying, a combination having a potential to satisfy specified conditions; creating a simulation program that, at a timing satisfying the timing specification received at the receiving, causes the conditional branch descriptions included in the combination extracted at the extracting to satisfy the specified conditions; and outputting, as assertion information of the sequential circuit, the simulation program created at the creating.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 is a chart of simulation verification using a cover statement;

FIG. 16 is a schematic diagram for explaining a correct application example;

FIG. 21 is a chart of an output example of a simulation result;

DESCRIPTION OF EMBODIMENT

Preferred embodiments of the present invention will be explained with reference to the accompanying drawings. In a present embodiment, a simulation program (assertion information) is created to execute processing that satisfies conditions specified by an inspector for conditional branches included in a sequential circuit to be verified and that satisfies a timing specification. Execution of the simulation program enables determination of whether processing that satisfies the condition specified by a verification scenario is performed and further enables prevention of a bug caused by an omission at verification.

Figure 1:
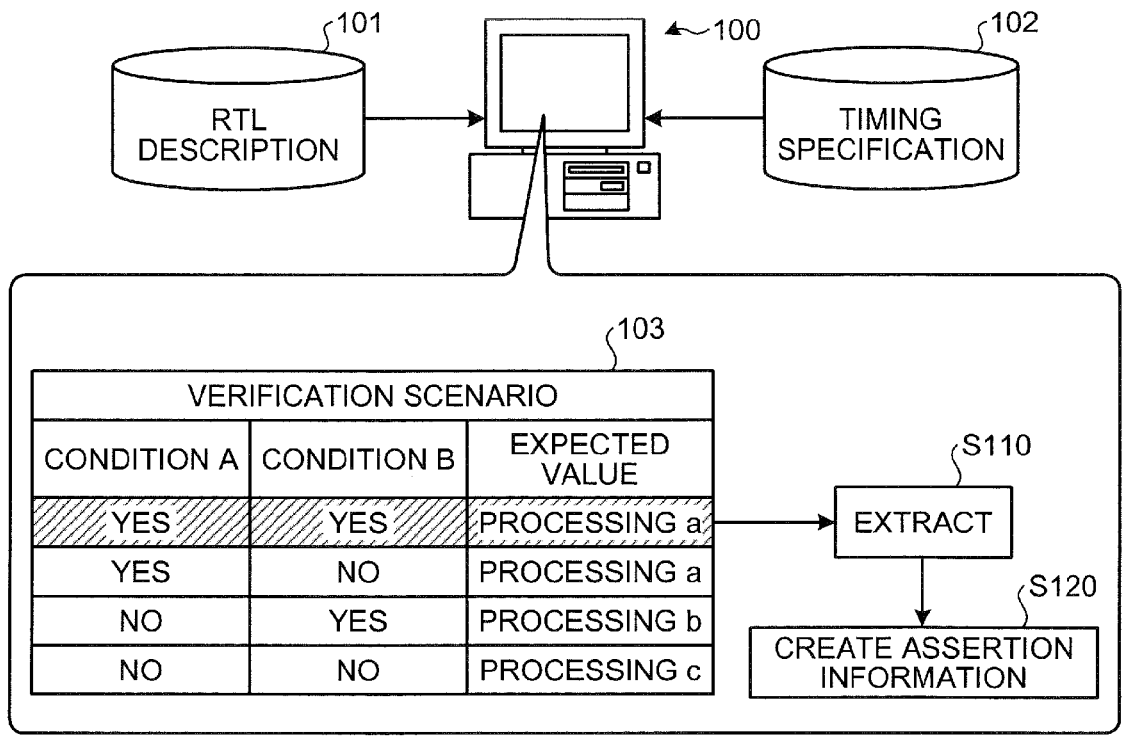
FIG. 1 is a schematic diagram outlining verification support processing according to a present embodiment.

FIG. 1 is a schematic diagram outlining verification support processing according to the present embodiment. Upon receipt of RTL description 101 to be verified, a verification support apparatus 100 extracts a combination of conditional branches included in the RTL description 101 (step S110). Thereafter, the verification support apparatus 100 receives a timing specification 102 concerning operation of hardware corresponding to the RTL description 101, and creates assertion information to determine whether all processing patterns concerning respective combinations are verified by a verification scenario 103 (step S120).

Figure 2:
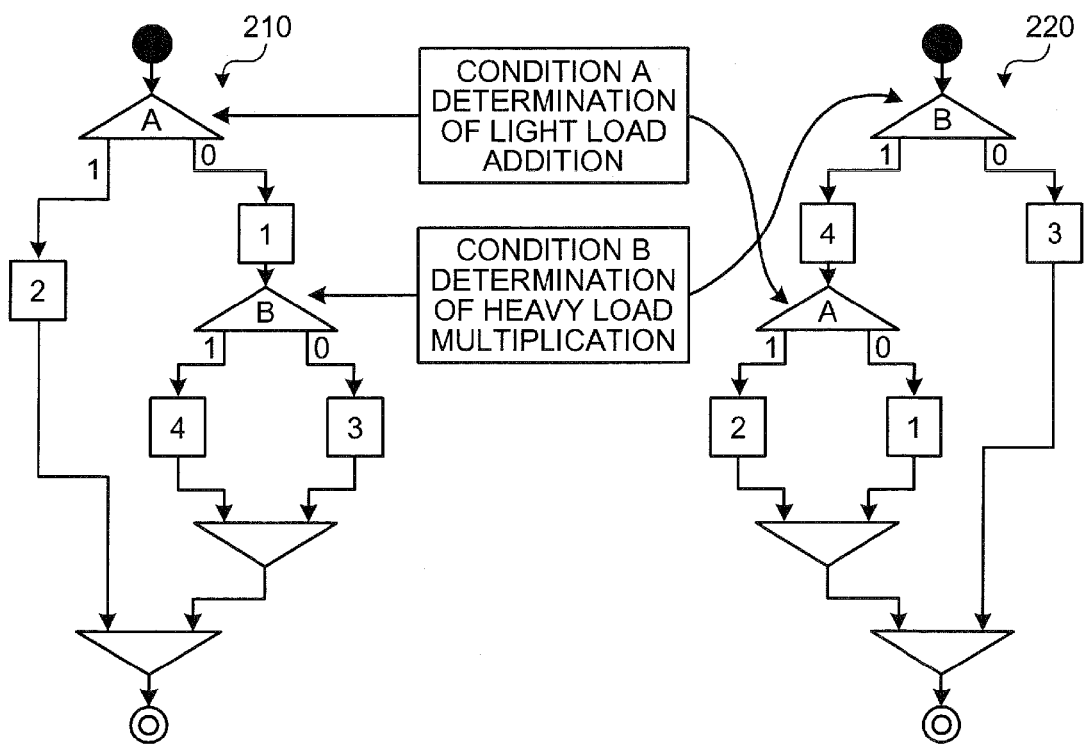
FIG. 2 is a schematic diagram for explaining an example where correct description has been changed to incorrect description.

FIG. 2 is a schematic diagram for explaining an example where correct description has been changed to incorrect description. Normally, a designer designs hardware based on specifications. Therefore, a correct description 210 is created first. Later, the designer may alter description contents to change the hardware design to improve efficiency.

Specifically, the sequence or the hierarchy of processes indicated by the description may be altered to minimize the number of clocks or to adjust delays. For example, in the correct description 210, if the condition A is a determination of addition for which the processing load is light and the condition B is a determination of multiplication for which the processing load is heavy, the designer may attempt to shorten the critical path in the entire description by executing first the condition B for which the processing load is heavy. The processing load herein indicates the number of clocks required to complete processing. For example, if the condition A is "1", it takes two clocks, and if the condition A is "0", it takes one clock. If the condition B is "1", it takes four clocks, and if the condition B is "0", it takes three clocks. As described, in the processing of a heavy load, the greater the number of clocks required, more time is required to complete the determination processing.

Therefore, in the example depicted in FIG. 2, the designer may attempt to minimize the total number of clocks by executing first the condition B for which the processing load is heavy. In the correct description 210, because the processing load for the condition A is light, if the determination of the condition B whose processing load is heavy is performed first and the determination of the condition A is performed next, the entire processing can be completed with less clocks without affecting the critical path. Depending on the description contents, a predetermined function may be achieved in the number of cycles as indicated in the specifications even if the sequence of processing therein is switched. However, if in the correct description 210, the condition A and the condition B are switched, the description becomes the incorrect description 220 in which the data cannot be output within the specified number of cycles when both the condition A and the condition B are "1".

As in the incorrect description 220, when the description sequence of the condition A and the condition B is switched to perform first the condition B whose processing load is heavy, it can be misunderstood that such a branch of "condition A=condition B=1" (both the conditions A and B are satisfied) cannot occur. This is because no such branch of "condition A=condition B=1" occurs in the correct description 210.

However, when the description is changed to the incorrect description 220, if the pattern in which the condition A and the condition B are both satisfied at the same time is not verified, verification for an error in condition determination is omitted. Therefore, in the present embodiment, the inspector arranges to extract a combination of conditional branches in which the condition A and the condition B are both satisfied at the same time at step S110 explained in FIG. 1.

Assertion information in which the condition A and the condition B extracted at step S110 are both satisfied at the same time, that is, a simulation program in which the condition A and the condition B are satisfied at the same time is created. Creation of the simulation program herein is achieved by creating a cover statement being condition A=Yes and condition B=Yes, for example. Furthermore, in the present embodiment, because the subject of verification is a sequential circuit, it is essential to satisfy the timing specification 102. Therefore, when the assertion information is created, such a cover statement is created in which both the condition A and the condition B are satisfied and the timing specification 102 is also satisfied.

Figure 3:
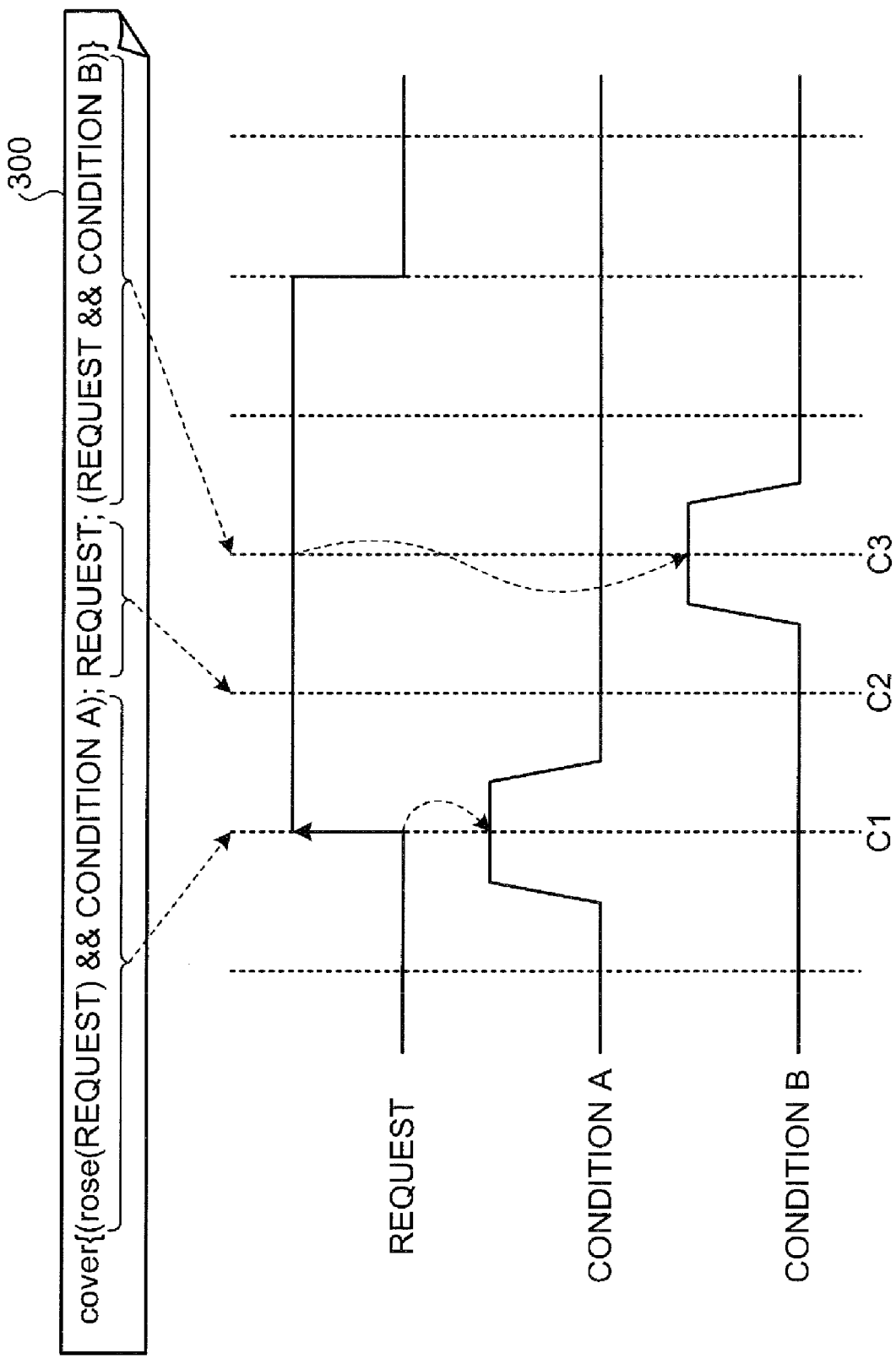
FIG. 3 is a schematic diagram for explaining creation of assertion information.

FIG. 3 is a schematic diagram for explaining creation of the assertion information. As depicted in FIG. 3, in the present embodiment, conditions to be satisfied are described for each clock as a cover statement 300. Specifically, by the cover statement 300, a simulation program is created in which at clock timing C1, a request is requested (high) and condition A=1; at clock timing C2, a request is requested; and at clock timing C3, a request is requested and condition B=1.

Other than the cover statement described above, provided the description achieves a simulation in which the condition A and the condition B are satisfied at the same time, a program language to be used is not particularly limited. Therefore, the program language can be selected appropriately with respect to the hardware description or the design environment. By executing the cover statement thus created, the conditional branch specified by the inspector is achieved in the hardware to be verified.

Therefore, based on whether the specified conditional branch is satisfied as a result of executing this assertion information, it is possible to determine whether verification for the conditional branch (conditional branch in which the condition A and the condition B are satisfied at the same time in this example) specified by the inspector has been performed. If the verification for the conditional branch specified by the inspector has not been performed, by performing the verification for the conditional branch for which the verification has been omitted, the verification coverage of truly 100 coverage can be achieved.

The verification support apparatus 100 by which the verification support processing according to the present embodiment with reference to FIG. 1 is implemented and the processing thereby are explained below. In the verification support processing according to the present embodiment, the assertion information for conditional branch processing in which an output result changes by switching conditional branches (condition A and condition B) in the correct description 210 as explained with reference to FIG. 2 is created. Naturally, for different description contents, the inspector can specify a different conditional branch for which the assertion information is created.

In the present embodiment, in any kind of hardware description, a case including more than one conditional branch is to be targeted for the creation of the assertion information. If the designer specifies the priority for conditional branches independently, the priority is applied. In addition to the specification of the priority, a part for which instruction is written indicating that plural conditional branches in the hardware description definitely cannot be satisfied at the same time is also excluded from the target.

Figure 4:
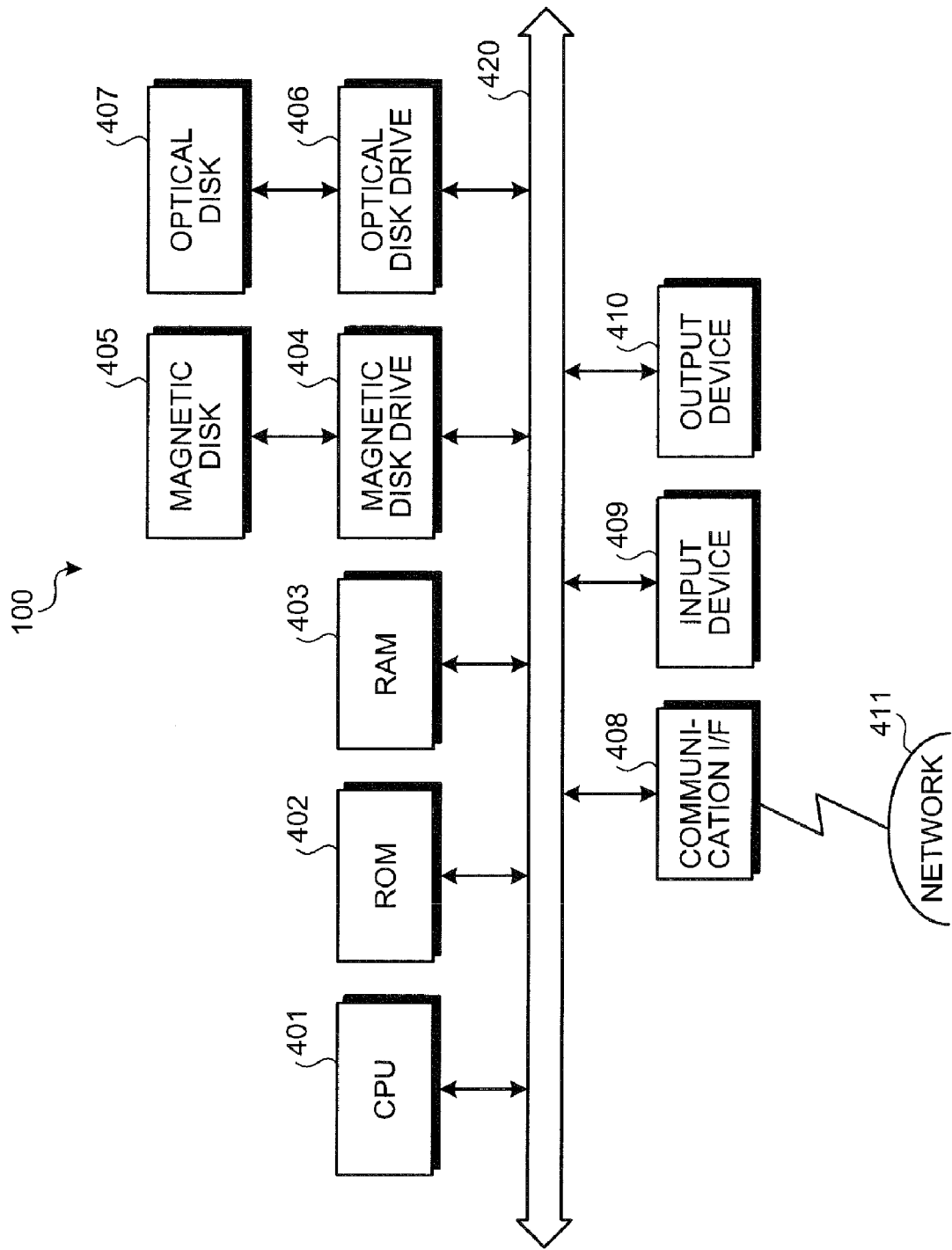
FIG. 4 is a block diagram of a verification support apparatus according to the embodiment.

FIG. 4 is a block diagram of a verification support apparatus according to the embodiment. As depicted in FIG. 4, a verification support apparatus 100 includes a central processing unit (CPU) 401, a read-only memory (ROM) 402, a random access memory (RAM) 403, a magnetic disk drive 404, a magnetic disk 405, a optical disk drive 406, an optical disk 407, a communication interface (I/F) 408, an input device 409, and an output device 410, connected to one another by way of a bus 420.

The CPU 401 governs overall control of the verification support apparatus 100. The ROM 402 stores therein various programs such as a boot program and a verification support program. The RAM 403 is used as a work area of the CPU 401. The magnetic disk drive 404, under the control of the CPU 401, controls the reading and writing of data with respect to the magnetic disk 405. The magnetic disk 405 stores therein the data written under control of the magnetic disk drive 404. The ROM 402 may further store therein the assertion information created by the verification support program and a verification program that executes verification simulation using the assertion information and verification scenario. In such a case, verification does not end with the assertion information created by the verification support apparatus 100, the inspector can be provided the actual results of the verification.

The optical disk drive 406, under the control of the CPU 401, controls the reading and writing of data with respect to the optical disk 407. The optical disk 407 stores therein the data written under control of the optical disk drive 406, the data being read by a computer.

The communication I/F 408 is connected to a network 411 such as a local area network (LAN), a wide area network (WAN), and the Internet through a communication line and is connected to other apparatuses through this network 411. The communication I/F 408 administers an internal interface with the network 411 and controls the input/output of data from/to external apparatuses. For example, a modem or a LAN adaptor may be employed as the communication I/F 408.

The input device 409 receives input from an external source to the verification supporting apparatus 420. The input device 409 can specifically be a keyboard, a mouse, etc.

In the case of the keyboard, the keyboard includes, for example, keys for inputting letters, numerals, and various instructions and performs the input of data. The input device 409 may be a touch-panel-type input pad or numeric keypad, etc. In the case of a mouse, the input device 409, for example, performs the movement of the cursor, selection of a region, or movement and size change of windows. The input device 409 may be a track ball or a joy stick provided each respectively has a function similar to a pointing device.

The output device 410 outputs verification scenarios created by the verification supporting apparatus 400 and verification results obtained using the verification scenarios. Specific examples of the output device 410 include a display, a printer, etc.

In the case of a display, the output device 410 displays, for example, data such as texts, images, functional information, etc., in addition to a cursor, icons, or tool boxes. A cathode ray tube (CRT), a thin-film-transistor (TFT) liquid crystal display, a plasma display, etc., may be employed as the display. In the case of a printer, the output device 410, for example, prints image data and text data. A laser printer or an ink jet printer may be employed as the printer.

Figure 5:
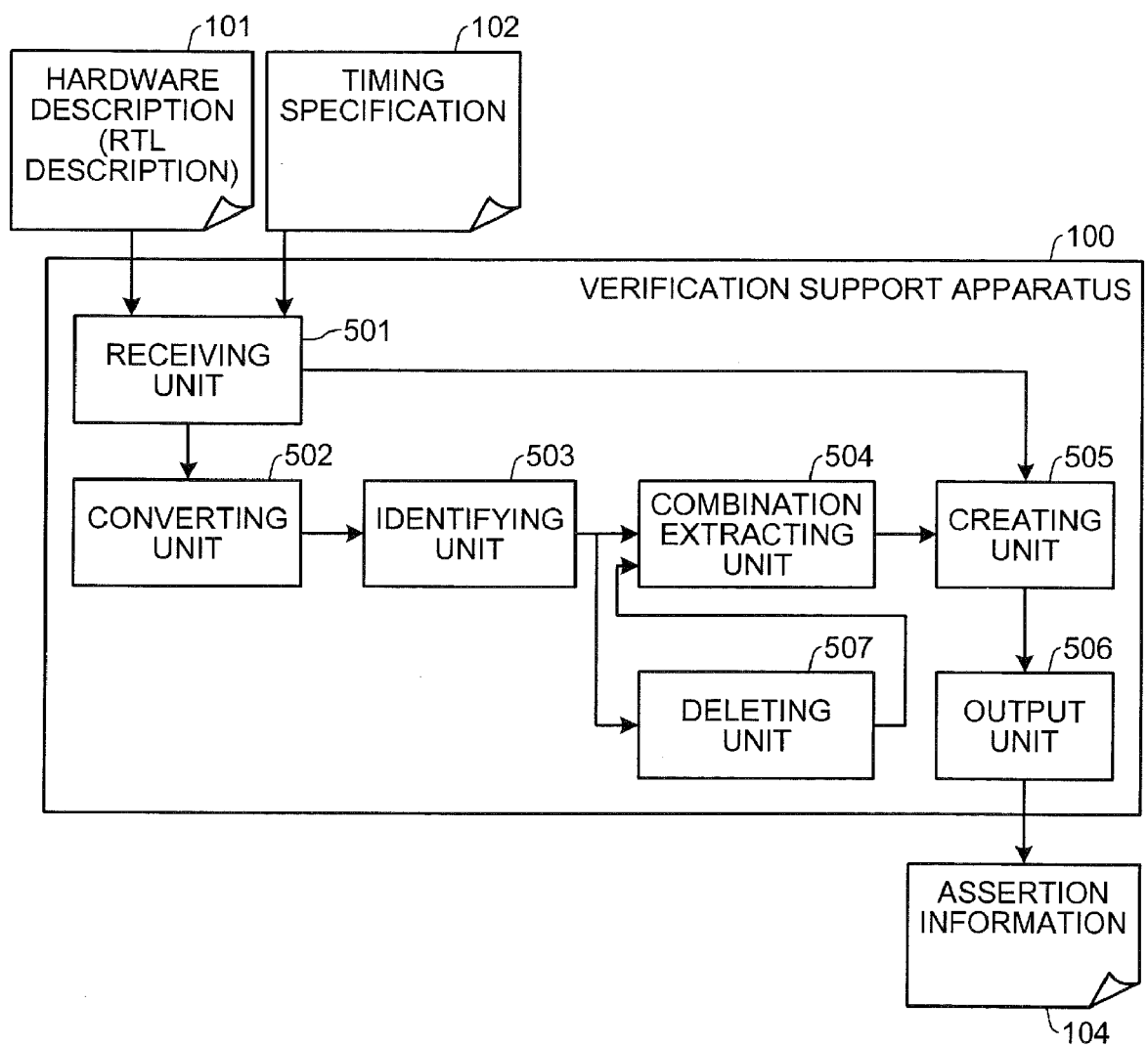
FIG. 5 is a functional diagram of the verification support apparatus.

FIG. 5 is a functional diagram of the verification support apparatus. The verification support apparatus 100 includes a receiving unit 501, a converting unit 502, an identifying unit 503, a combination extracting unit 504, a creating unit 505, an output unit 506, and a deleting unit 507. These functional units (the receiving unit 501 to the deleting unit 507) to be a control unit are implemented by causing the CPU 401 to execute a verification program stored in a storage area such as the ROM 402, the RAM 403, the magnetic disk 405, and the optical disk 407, or by causing another device that is connected thereto through the communication I/F 408 to execute the verification program.

The receiving unit 501 receives hardware description of a sequential circuit to be verified and the timing specification 102 that indicates the timing constraints of the hardware description. Accordingly, in this example, the RTL description 101 described in FIG. 1 is input as the hardware description 101 of the sequential circuit to be verified, and the receiving unit 501 receives the RTL description 101. The received hardware description 101 is stored in a storage area such as the RAM 403, the magnetic disk 405, and the optical disk 407.

The converting unit 502 converts the hardware description 101 received by the receiving unit 101 into a CFG that expresses the flow of control of the sequential circuit to be verified. The CFG obtained by the conversion performed by the converting unit 502 is stored in a storage area such as the RAM 403, the magnetic disk 405, and the optical disk 407. Through the CFG obtained by the converting unit 502, combinations of conditional branch descriptions in hierarchy can be identified easily.

When the hardware description is converted into a CFG by the converting unit 502, the identifying unit 503 identifies, from the CFG, conditional branch descriptions that are connected in parallel as a combination of conditional branch descriptions in hierarchy. Conditional branch descriptions in hierarchy are, for example, the combination of the condition A and the condition B described at a lower level in the correct description 210 depicted in FIG. 2. If more than one combination in hierarchy is present among the extracted conditional branches, all such combinations are identified. Furthermore, in addition to a combination of two levels as condition A–condition B, if a combination further including a conditional branch at a higher level or a lower level is present, a combination of three levels or four levels is identified.

Moreover, when the receiving unit 501 receives priority information that indicates execution priority relative to other conditional branches for conditional branches included in the hardware description 101, the identifying unit 503 may identify a combination of conditional branch descriptions in hierarchy based on the priority information. The priority information is information indicating a hierarchical relation of conditional branches, and for example, when the condition A is described at a higher level than the condition B, it is set as "condition A>condition B". When the priority information indicating "condition A>condition B" is received, the identifying unit 503 may output the combination, identifying the hierarchical relation of the condition A and the condition B. Any combination identified by any method is stored in a storage area such as the RAM 403, the magnetic disk 405, and the optical disk 407.

The combination extracting unit 504, from among the combinations of conditional branch descriptions identified by the identifying unit 503, extracts a combination having a potential to satisfy a condition specified. In this example, the condition specified by the inspector requires all conditional branches to be effective, and therefore, the combination having a possibility that all conditions are "1" (Yes) is extracted from among the combinations of conditional branch descriptions that are identified by the identifying unit 503. The extracted combination is stored in a storage area such as the RAM 403, the magnetic disk 405, and the optical disk 407.

The creating unit 505 creates a simulation program in which the conditional branch description extracted by the combination extracting unit 504 satisfies the specified condition at the timing satisfying the timing specification received by the receiving unit 501. Because the condition that all conditional branches are effective is specified as described above, a simulation program is created by which results of determination of the conditions included in the extracted combination are all "1 (Yes)" within a clock condition specified in the timing specification. The simulation program created herein may be of any computer program provided the condition above is satisfied. The created simulation program is stored in a storage area such as the RAM 403, the magnetic disk 405, and the optical disk 407.

The output unit 506 outputs the simulation program created for each combination by the creating unit 505, as the assertion information 104 of the sequential circuit to be verified. In other words, with each extracted combination, a simulation program in which conditions in the combination are satisfied at the same time is associated. The form of output includes display on a display device, print out by a printer, and transmission to an external device through the communication I/F 408. Further, output may be to a storage area such as the RAM 403, the magnetic disk 405, and the optical disk 407.

The functional units 501 to 506 explained above are the minimum components required to achieve the verification support processing according to the present embodiment. In the verification support apparatus 100, the deleting unit 507 is provided as a function to speed up the assertion creation processing described above.

The deleting unit 507 deletes a combination of conditional branch descriptions from among the combinations of conditional branch descriptions identified by the identifying unit 503, the combination being designated in advance. Therefore, the combinations of conditional branch descriptions after deletion are output from the deleting unit 507 and are stored in a storage area such as the RAM 403, the magnetic disk 405, and the optical disk 407. When the deleting unit 507 is used, the combinations remaining after the deletion of by the deleting unit 507 are input to the combination extracting unit 504 and the combination extracting unit 504 extracts a combination having the potential of satisfying the specified condition. As described, by providing the deleting unit 507, the number of combinations subject to extraction by the combination extracting unit 504 can be reduced. Accordingly, the processing load on the combination extracting unit 504 can be reduced.

The verification support apparatus 100 creates the assertion information 104 by the functional units 501 to 507 explained above, to check whether verification of a conditional branch that has a possibility of being omitted from verification in the conventional verification technique has been performed. Verification of a sequential circuit can be performed by the conventional verification apparatus using this assertion information 104, or verification using the assertion information 104 can be performed by further providing to the verification support apparatus 100, a function to perform the verification. Therefore, in the following description, a series of the processing when both the functional unit achieving up to the creation of the assertion information explained in FIG. 5 and a functional unit to perform verification using the created assertion information are provided in the verification support apparatus 100 is explained.

Figure 6:
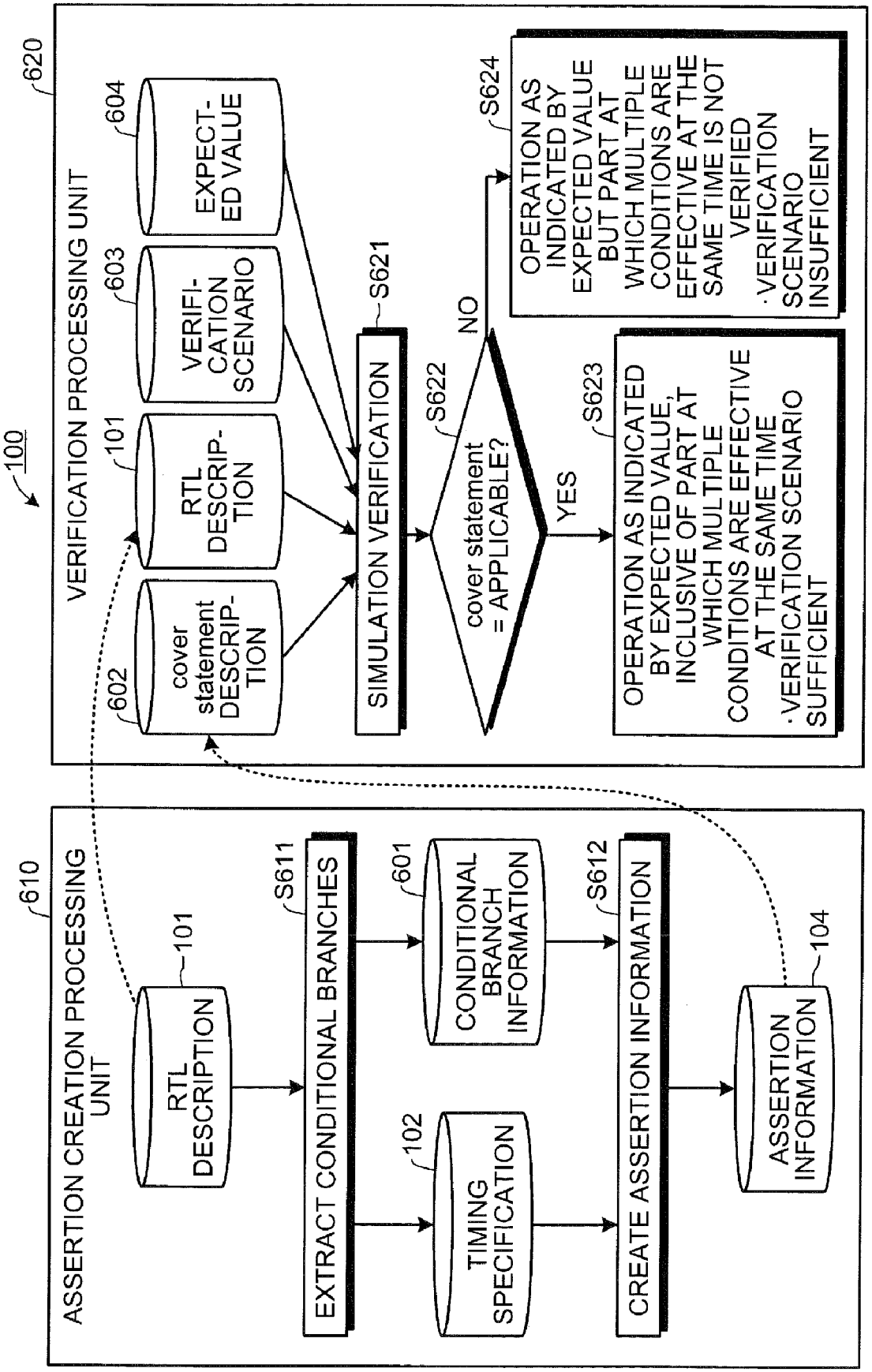
FIG. 6 is a schematic diagram for explaining processing performed by the verification support apparatus.

FIG. 6 is a schematic diagram for explaining processing performed by the verification support apparatus. As depicted in FIG. 6, the verification support apparatus 100 includes an assertion creation processing unit 610 and a verification processing unit 620. The assertion creation processing unit 610 is a functional unit that performs the processing to create the assertion information by which the specified condition is satisfied, explained in FIG. 5. The verification processing unit 620 is a functional unit that determines whether verification for the specified condition has been performed, using the assertion information created by the assertion creation processing unit 610. A series of processing performed by each of the functional units 610 and 620 is explained.

First, processing performed by the assertion creation processing unit 610 is explained. The assertion creation processing unit 610 performs roughly two types of processing including processing to extract conditional branches (step S611) and processing to create the assertion information (step S612).

Figure 7:
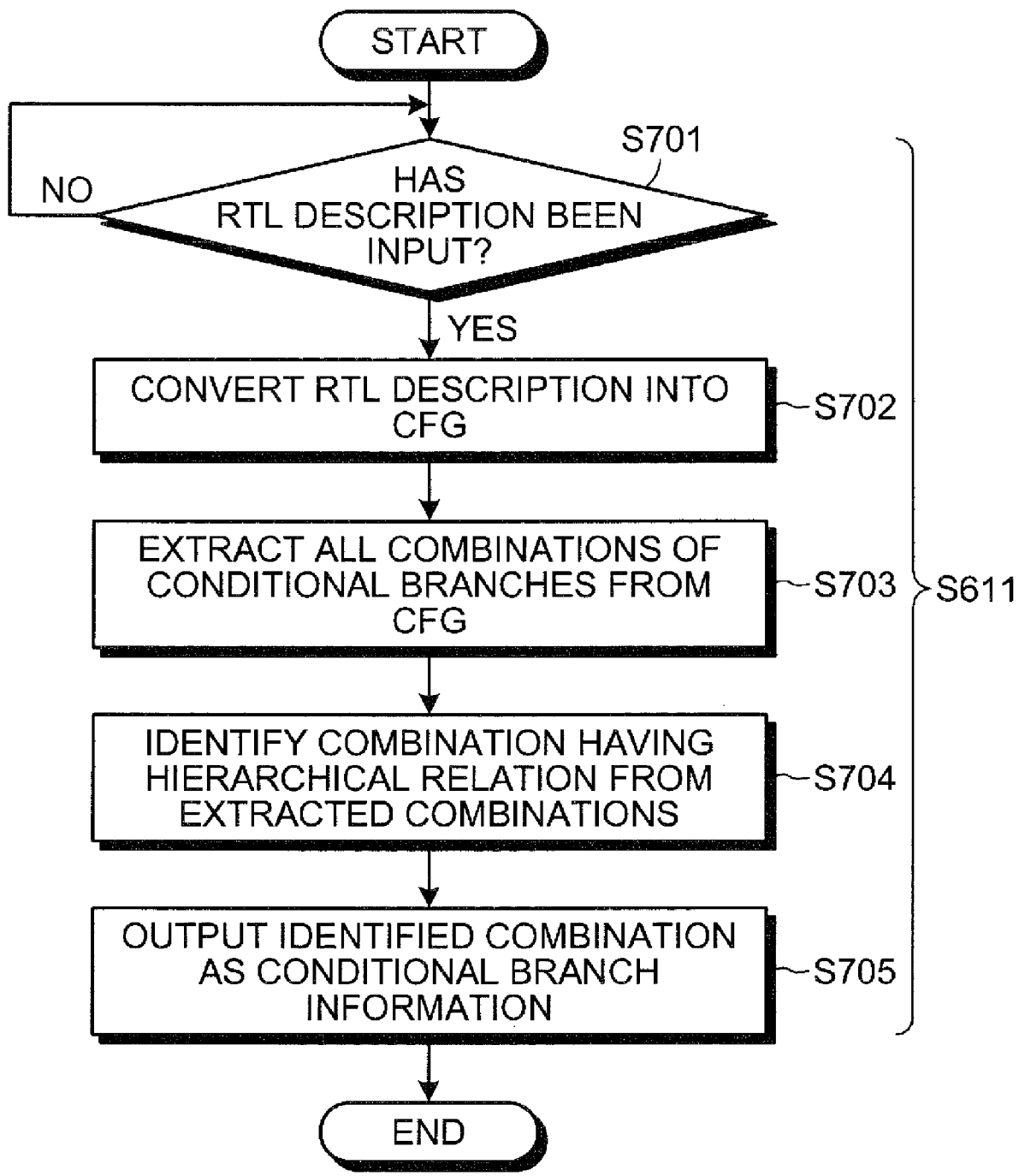
FIG. 7 is a flowchart of conditional branch extraction processing.

First, the processing to extract conditional branches performed by the assertion creation processing unit 610 explained in FIG. 6 is explained. FIG. 7 is a flowchart of the conditional branch extraction processing. As depicted in the flowchart in FIG. 7, first, it is determined whether the RTL description 101 has been input (step S701). Waiting occurs until the RTL description 101 is input (step S701: NO), and when the RTL description 101 is input (step S701: YES), the input RTL description 101 is converted into a CFG (step S702).

Figure 8:
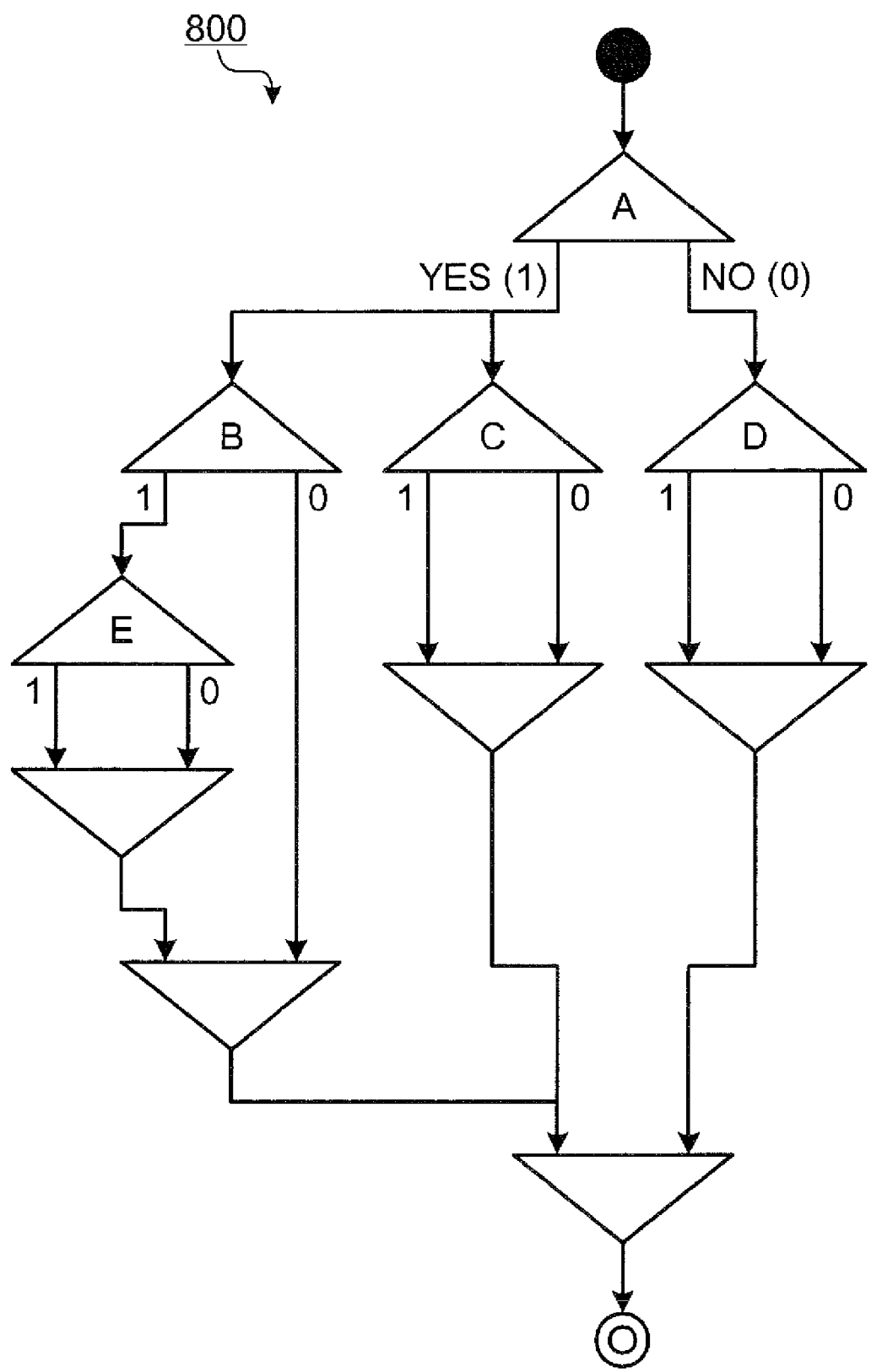
FIG. 8 is a schematic diagram for explaining an example of CFG conversion.

The conversion into a CFG is explained herein. FIG. 8 is a schematic diagram for explaining an example of CFG conversion. A CFG is a graph expressing a flow of control with respect to the hardware description. Therefore, a CFG 800 expresses a flow of control from the beginning (black circle in FIG. 8) to the end (concentric rings in FIG. 8) with respect to the RTL description 101 input to the verification support apparatus 100. By conversion of the RTL description 101 into a CFG, the hierarchical relation among respective conditional branches is identified, and a combination of conditional branches in hierarchy can be identified easily.

Reference of the explanation returns to FIG. 7. All combinations of conditional branches are extracted from the CFG obtained by conversion at step S702 (step S703). A combination in hierarchy is then identified from among the all combinations extracted at step S703 (step S704). The hierarchical relation is relation of conditional branches connected in series in the CFG. In the case of the CFG 800 depicted in FIG. 8, A and B, A and B and E, A and C, A and D, and B and E are identified to have hierarchical relations. The respective combinations identified at step S704 are output as conditional branch information 601 (step S705), and a series of the conditional branch extraction processing ends.

Figure 9:
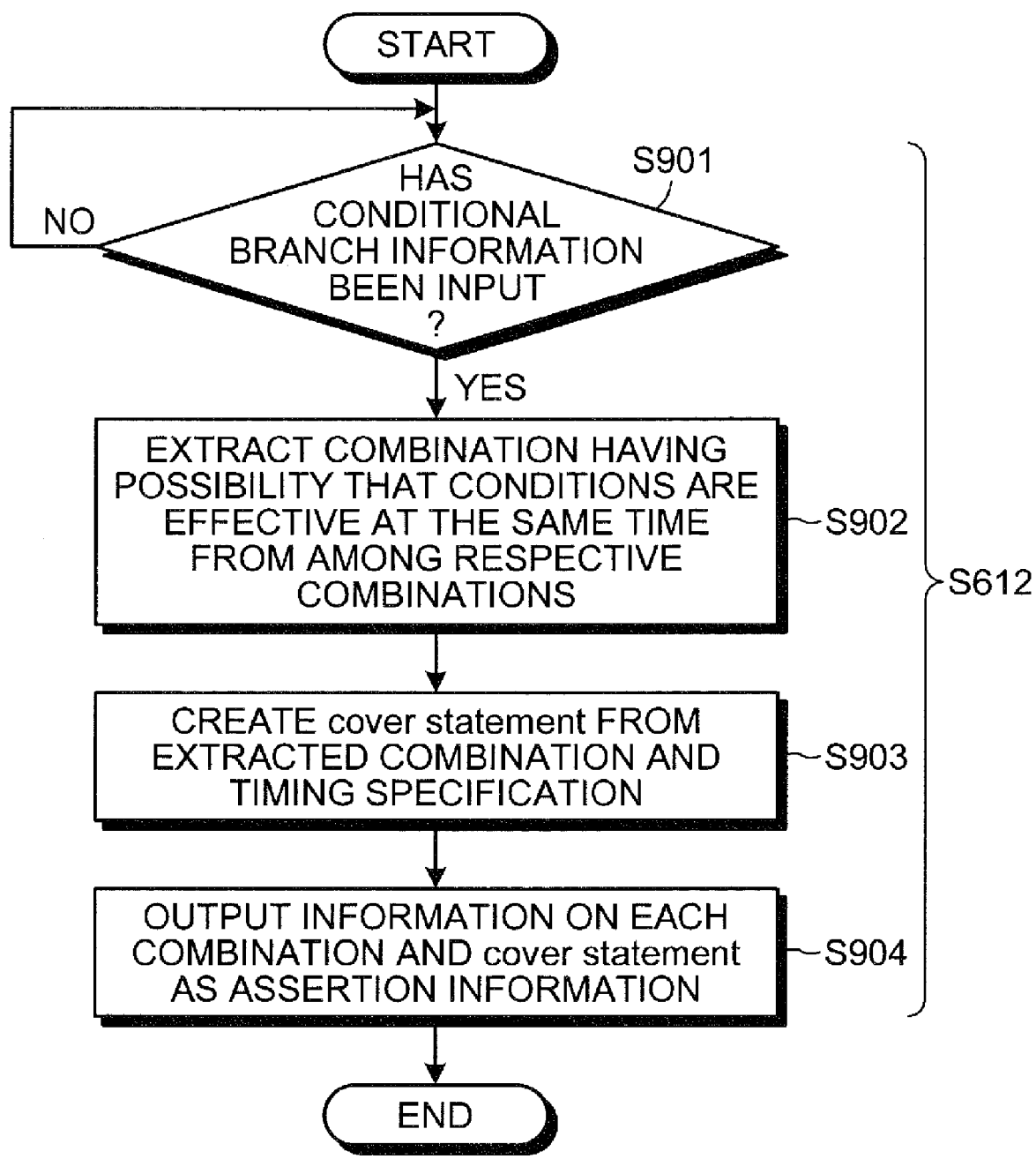
FIG. 9 is a flowchart of assertion information creation processing.

Next, the processing to create the assertion information by the assertion creation processing unit 610 explained in FIG. 6 is explained. FIG. 9 is a flowchart of the assertion information creation processing. As depicted in the flowchart in FIG. 9, first, it is determined whether the conditional branch information 601 has been input (step S901). At step S901, the determination is made based on whether the conditional branch information 601 extracted by the conditional branch extraction processing explained in FIG. 7 has been input.

Waiting occurs until the conditional branch information 601 is input (step S901: NO), and when the conditional branch information 601 is input (step S901: YES), a combination having a possibility that conditional branches are effective at the same time is extracted from among the combinations included in the input conditional branch information 601 (step S902). Accordingly, because in the combination of A and D, A=No and the conditions in this combination are not satisfied at the same time, the combination of A and D is deleted.

A cover statement that satisfies the clock condition (complete output within five clocks) and the respective conditions at the same time (condition A=condition B=1) is then created from the combination extracted at step S902 and the timing specification 102 (step S903), and finally, information concerning the combination and the cover statement is output as the assertion information 104 (step S904), and a series of the assertion information creation processing ends. For example, if the sequential circuit to be verified is the description of the CFG 800, the assertion information 104 is created for the combinations of A and B, A and C, A and B and E, and B and E.

Figure 10:
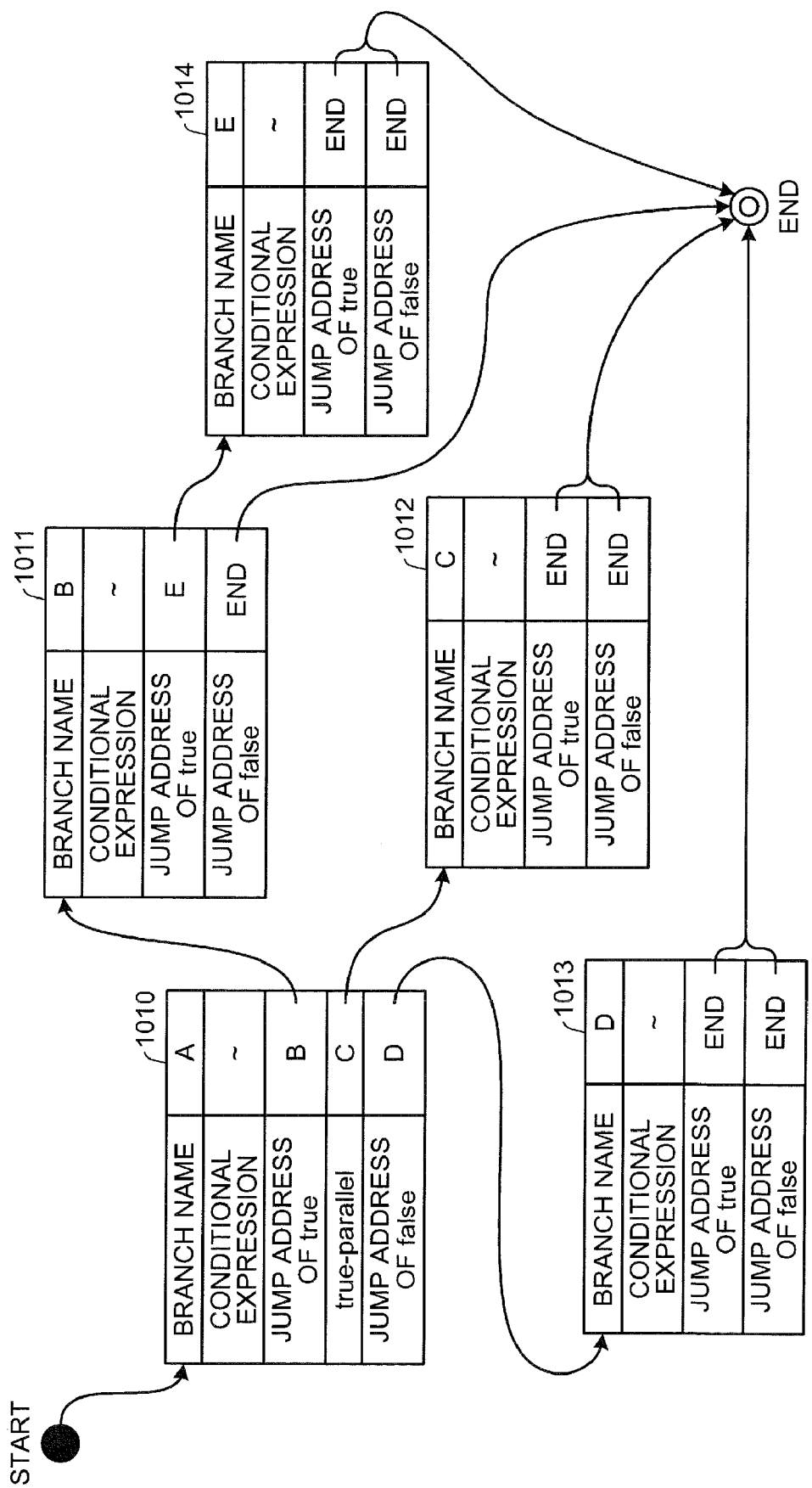
FIG. 10 is a schematic diagram of one example of data configuration of a CFG.

Next, the extraction of the conditional branches using the CFG at step S703 in FIG. 7 is explained in detail. First, FIG. 10 is a schematic diagram of one example of data configuration of a CFG. The RTL description 101 subjected to CFG conversion is converted into list structures 1010 to 1014 in which branch name, conditional expression, and jump addresses when a result of determination of the conditional expression is true and false are indicated. Further, when parallel operation is performed by hardware included in the RTL description 101 to be verified, a branch to multiple jump addresses (the list structure 1011 indicating branch name B and the list structure 1012 indicating branch name C) is prepared, as the information concerning the jump addresses in the case of true of the list structure 1010 indicating branch name A.

Figure 11:
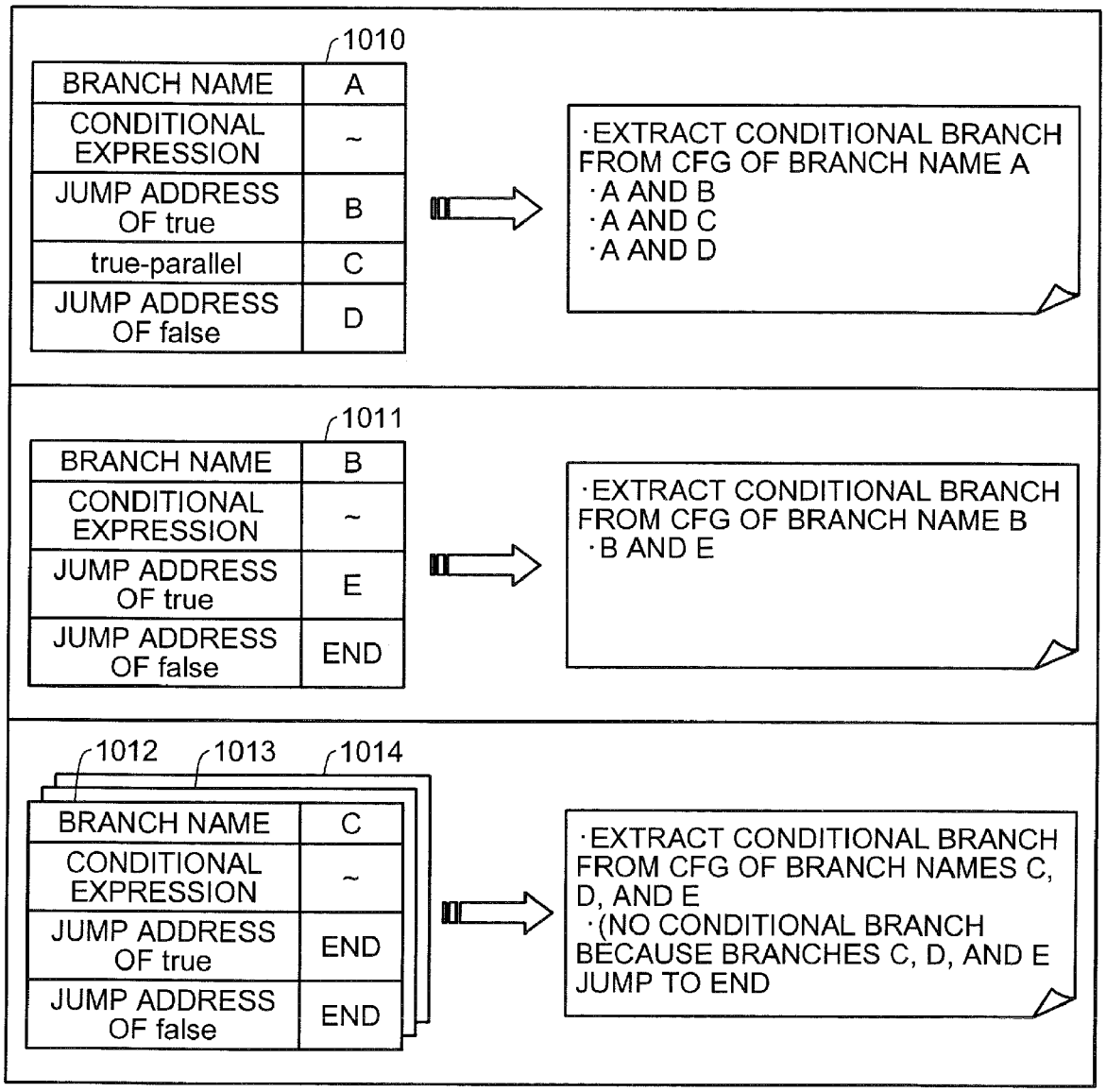
FIG. 11 and FIG. 12 are schematic diagrams for explaining extraction processing of priority relation using the CFG.
Figure 12:
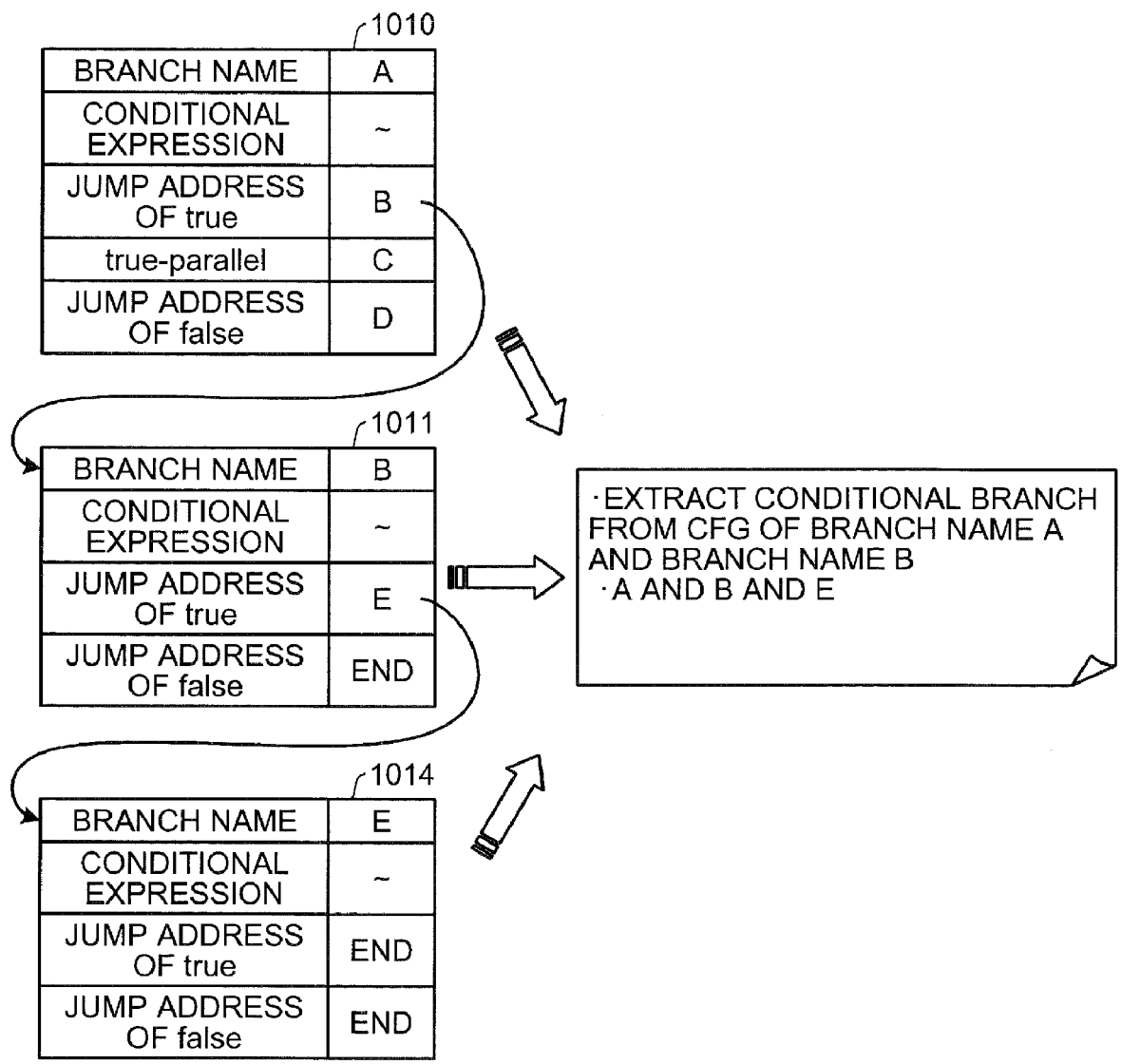

FIG. 11 and FIG. 12 are schematic diagrams for explaining the extraction processing of priority relation using the CFG. At step S703 in FIG. 7, the priority relation of conditional branches is extracted with reference to information concerning the jump addresses of the respective list structures 1010 to 1014.

Specifically, in the list structure 1010, the jump address when a result of determination of the conditional expression is true or false is referenced and the branch names B, C, and D are extracted as conditional branch descriptions positioned at a level below the conditional branch of the branch name A. Similarly, in the list structure 1011, the branch name E is extracted as a conditional branch description positioned at a level below the branch name B. Although extraction of a conditional branch description positioned at a level below the branch names C, D, and E is attempted in the list structures 1012, 1013, and 1014, because the jump addresses thereof in the case of true or false are set to END, it is determined that a conditional branch description positioned at a level below the branch names C, D, and E is not present.

Moreover, with respect to the combinations extracted as a combination having the hierarchical relation as described above, determination whether the combinations have a hierarchical relation is further made. In this example, as depicted in FIG. 12, because the branch name E is further present at a level below the branch name B that is extracted as the conditional branch description positioned at a level below the branch name A, the combination of A, B and E is extracted as the combination of conditional branch description in hierarchy. As described, through the use of the CFG to reference to the list structures, the combinations A and B, A and C, A and D, B and E, and A and B and E are extracted as the combinations having a hierarchical relation.

Furthermore, by adding extended processing to the verification support apparatus 100 described above, the processing load can be reduced. Extended processing of the verification support apparatus 100 may be processing to delete, from among combinations of conditional branches, a combination of conditional branches that definitely cannot be effective at the same time.

Figure 13:
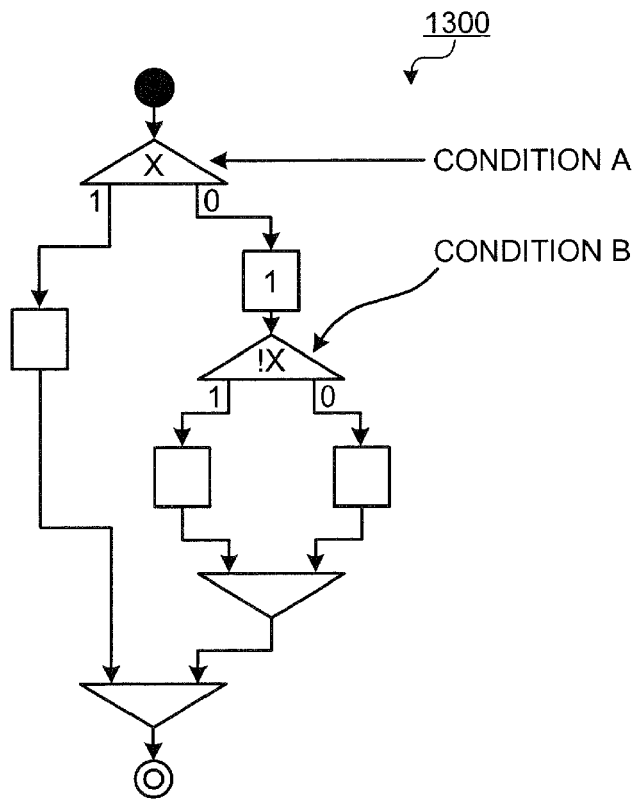
FIG. 13 is a schematic diagram for explaining a combination of conditional branches that cannot be effective at the same time.

FIG. 13 is a schematic diagram for explaining a combination of conditional branches that cannot be effective at the same time. From among the combinations of conditional branches included in the sequential circuit to be verified, a combination of conditional branches that definitely cannot be effective at the same time can be excluded targets for which the assertion information 104 is created in advance. For example, in the case of a CFG 1300, the condition A and the condition B are exclusive, and cannot be effective at the same time. Generally, a combination of conditional branches included in a CFG corresponds to any one of "effective at the same time", "not known whether effective at the same time", and "not effective at the same time". Therefore, the combination that is determined definitely to be "not effective at the same time" from the description can be deleted from the combinations of conditional branches, thereby contributing to reduction of the processing load.

Figure 14:
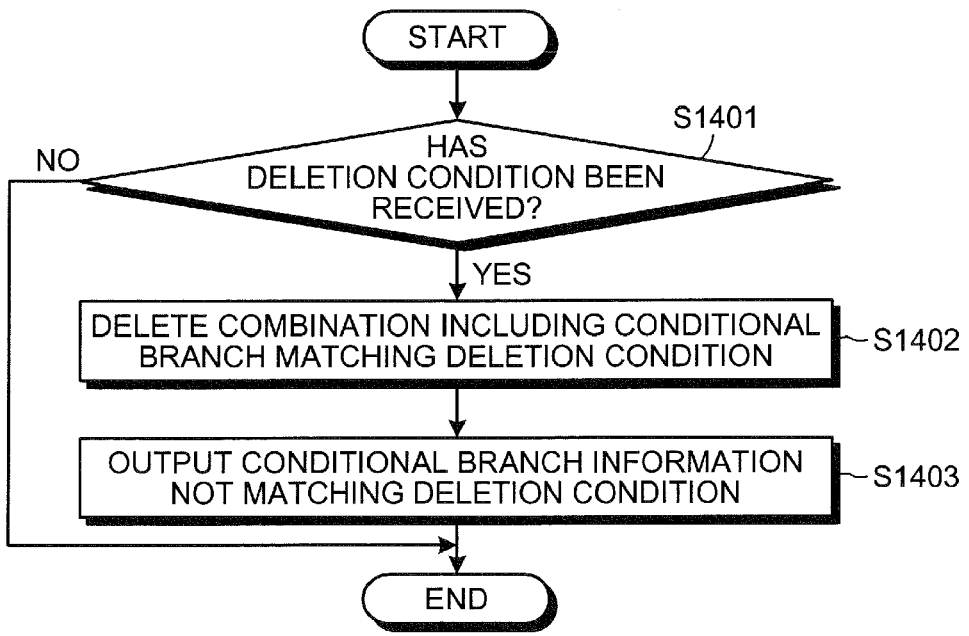
FIG. 14 is a flowchart of extended processing using a deletion condition.

FIG. 14 is a flowchart of extended processing using a deletion condition. Extended processing using the deletion condition is performed between the processing to extract the conditional branches described above (step S611) and the processing to create the assertion information (step S612), and is performed upon input of the conditional branch information 601 as a trigger. As depicted in the flowchart in FIG. 14, first, it is determined whether a deletion condition has been received after the input of the conditional branch information 601 (step S1401). If a deletion condition is received (step S1401: YES), it is determined that the extended processing is to be applied, and a combination including conditional branches matching the deletion condition is deleted from among the combinations of conditional branches included in the input conditional branch information 601 (step S1402).

If a deletion condition is not received at step S1401 (step S1401: NO), it is determined that the extended processing is not to be applied, and the process proceeds to step S612. The combinations of conditional branches remaining after the deletion processing at step S1402 are output as the conditional branch information 601 (step S1403), and the process proceeds to step S612.

As described, by adding the extended processing prior to the processing of creation of the assertion information 104, combinations for which conditions cannot be effective at the same time are deleted. Therefore, a combination having a possibility that the conditions can be effective at the same time can be identified more efficiently.

Next, the verification processing unit 620 that performs verification of a circuit to be verified using the assertion information 104 created by the assertion creation processing unit 610 is explained. As depicted in FIG. 6, in the verification processing unit 620, a cover statement description 602 of the combination of conditional branches wished to be verified is extracted from the assertion information 104 created by the assertion creation processing unit 610. Simulation verification is then performed using the RTL description 101 of the circuit, a verification scenario 603, and an expected value 604 corresponding to the verification scenario 603 (step S621).

It is determined whether the cover statement description 602 is applicable from a result of the verification at step S621 (step S622). When the cover statement description 602 is determined to be applicable (step S622: YES), it is determined that operation as indicated by the expected value 604 has been performed inclusive of a part at which multiple conditional branches are effective at the same time (step S623). Such determination means the state in which all required verification scenarios 603 are included.

On the other hand, when the cover statement description 602 is determined to be inapplicable (step S622: NO), it is determined that although operation as indicated by the expected value 604 is performed, a part at which multiple conditional branches are effective at the same time has not been verified (step S624). This means that the verification scenario 603 is not sufficient. Therefore, step S624 indicates that there is an omission in the verification. Thus, the inspector can perform appropriate processing such as an addition of the verification scenario 603 where multiple conditional branches are effective at the same time.

FIG. 15 is a chart of the simulation verification using a cover statement. A chart 1500 indicates verification states of a circuit to be verified, according to results of the simulation verification described above. When the expected value 604 and an output in the simulation do not coincide, it is determined that operation as indicated by the expected value cannot be performed as a result of a bug present in the RTL description 101. Therefore, the inspector can perform processing to eliminate the bug.

As described, with the verification support apparatus 100 according to the present embodiment, verification omission that has not been resolved even with a verification scenario of 100 coverage in the conventional line coverage or path coverage, can be detected by focusing on a specific condition of conditional branches.

Next, an actual example with specific values is explained. First, a specification is set specifying that data be output within five cycles regardless of the value of the condition A and the condition B. FIG. 16 is a schematic diagram for explaining a correct application example. To make the path coverage of a circuit 1601 to be verified 100, a verification scenario having 100 path coverage should be given. When verification is performed by a verification scenario, data is output within five cycles in any of the cases as depicted in a chart 1600, and the circuit is determined to be a sequential circuit that satisfies the specification.

Figure 17:
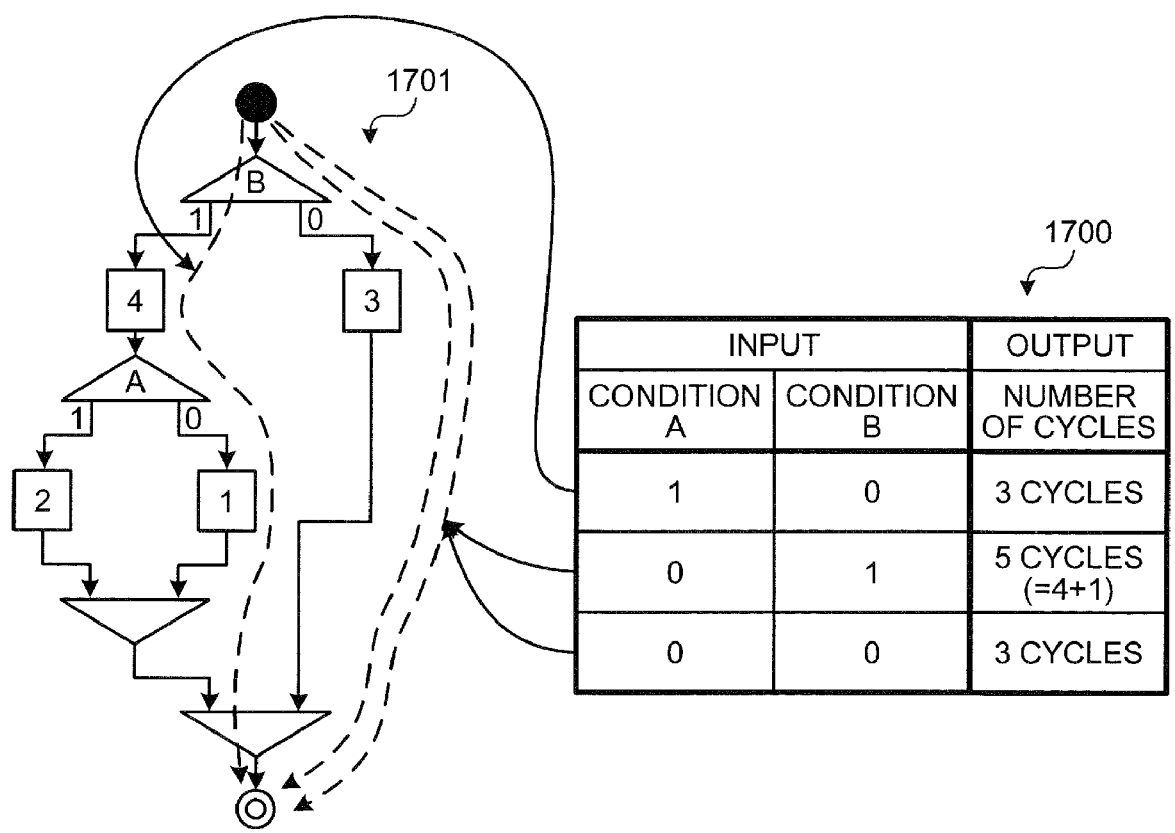
FIG. 17 is a schematic diagram for explaining an incorrect application example.

Input: Condition A=1, Condition B=0 Expected value: Data output within five cycles Input: Condition A=0, Condition B=1 Expected value: Data output within five cycles Input: Condition A=0, Condition B=0 Expected value: Data output within five cycles On the other hand, FIG. 17 is a schematic diagram for explaining an incorrect application example. As explained with reference to FIG. 2, a circuit 1701 to be verified has been changed to an incorrect application example (the hierarchical relation between the condition A and the condition B is changed) in which a part of description has been changed by the designer with the intention of improving the processing efficiency of the circuit 1601. Because the designer has not noticed the error and the above specification (output data within five cycles) is demanded also for the circuit 1701, the same verification scenario 603 is given.

However, although the application example is the incorrect application example, the path coverage is 100 in the verification scenario described above, as depicted in a chart 1700. Even with the 100 path coverage, verification of an incorrect application part is not performed, and the bug is overlooked. Therefore, for a circuit for which the designer has changed a conditional branch as the circuit 1701, it is required to create the assertion information 104 and to check whether there is a verification omission.

Figure 18:
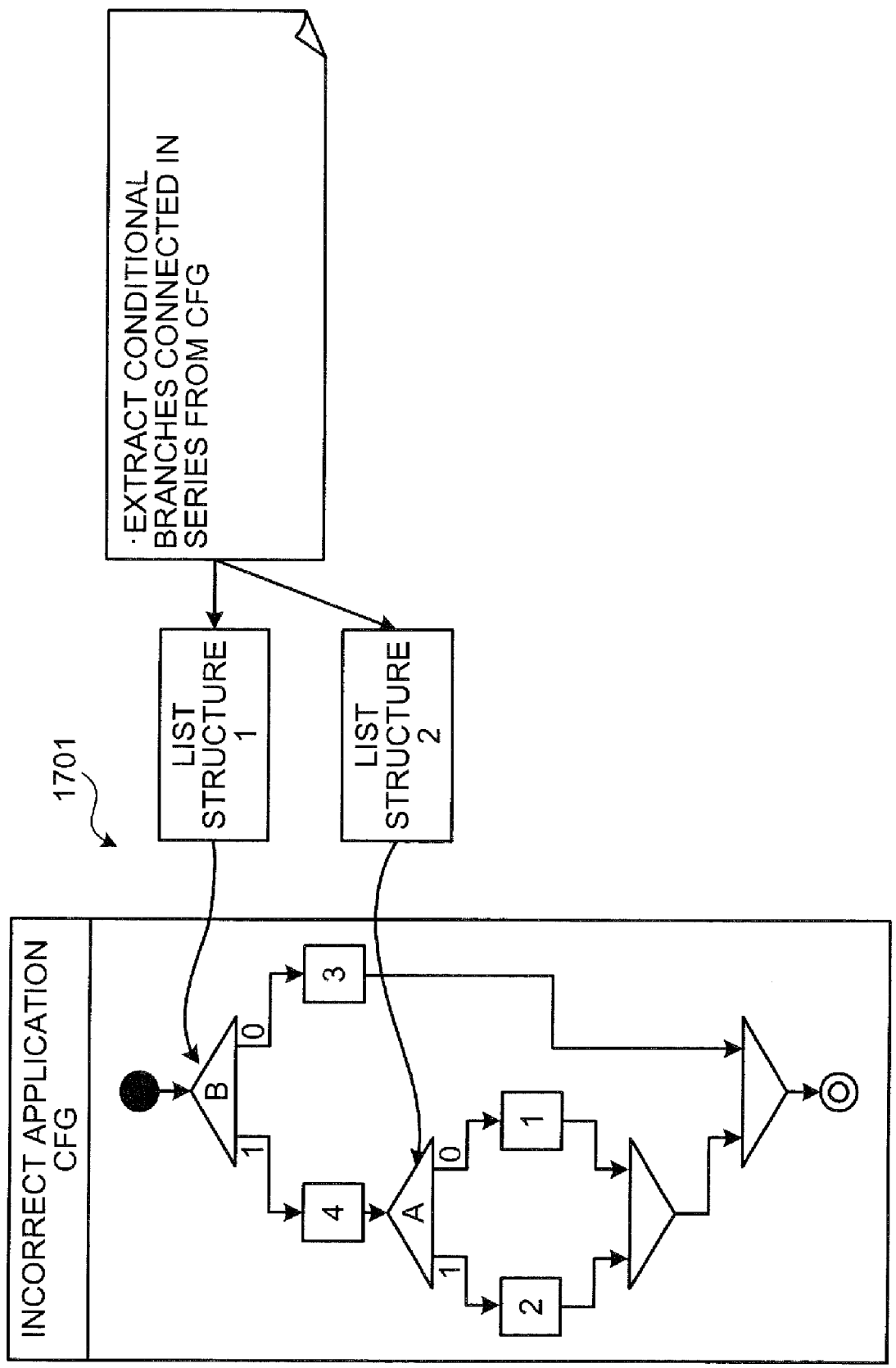
FIG. 18 is a schematic diagram for explaining extraction of a conditional branch having a possibility that conditions are satisfied at the same time.

FIG. 18 is a schematic diagram for explaining extraction of a conditional branch having a possibility that conditions are satisfied at the same time. As depicted in FIG. 18, a list structure 1 indicating a flow of data of the condition B and a list structure 2 indicating a flow of data of the condition A are obtained from the circuit 1701 depicting a CFG of the incorrect application, and conditional branches that are connected in series are identified as a combination of conditional branches in hierarchy. Moreover, when priority is set for the conditional branches in advance such as condition B>condition A, the hierarchical relation between the condition A and the condition B can be identified with reference to this priority.

Figure 19:
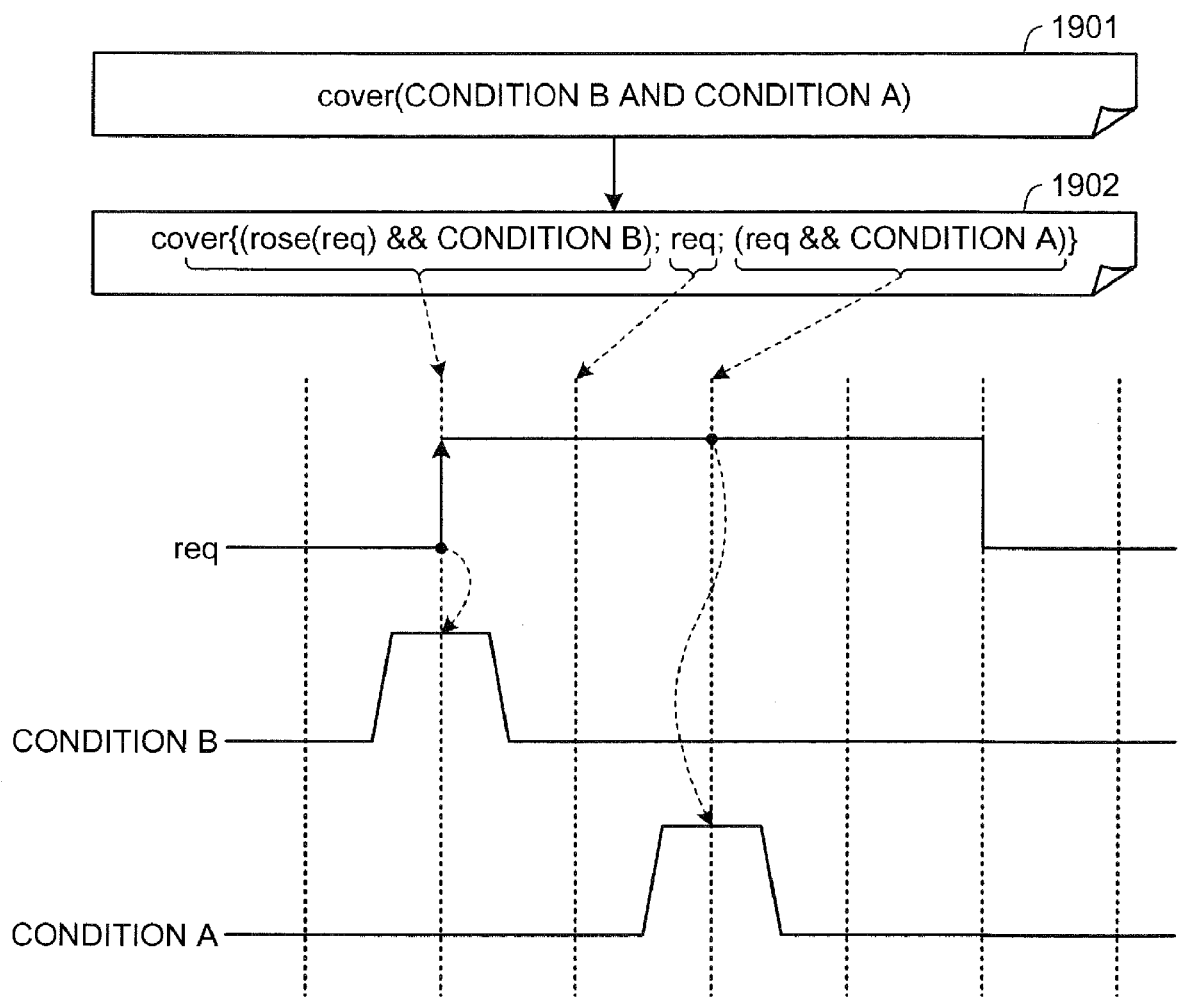
FIG. 19 is a schematic diagram for explaining creation of a cover statement.

After a combination of conditional branches in hierarchy is identified from the CFG as explained in FIG. 18, the assertion information 104 having a condition in which the conditions A and B are satisfied at the same time is created. FIG. 19 is a schematic diagram for explaining creation of a cover statement. First, a cover statement 1901 to satisfy the identified combination of conditional branches in hierarchy is created. Thereafter, the timing specification 102 is added to the created cover statement 1901. Thus, a cover statement 1902 by which the combination of conditional branches are both effective and the timing specification 102 is satisfied is created.

"rose(req)condition B" described in the cover statement 1902 is a service priority list (SPL) description that causes the condition B=1 upon a rise indicating input of a request (req) at the first cycle. Furthermore, "req" described next is a SPL description to maintain the state where the request (req) is input. "reqcondition A" is an SPL description that causes the condition A=1 at the third cycle. As described, by using assertion grammar, the assertion information 104, by which the specified condition and the timing specification 102 are satisfied for each combination of conditional branches, may be created.

Figure 20:
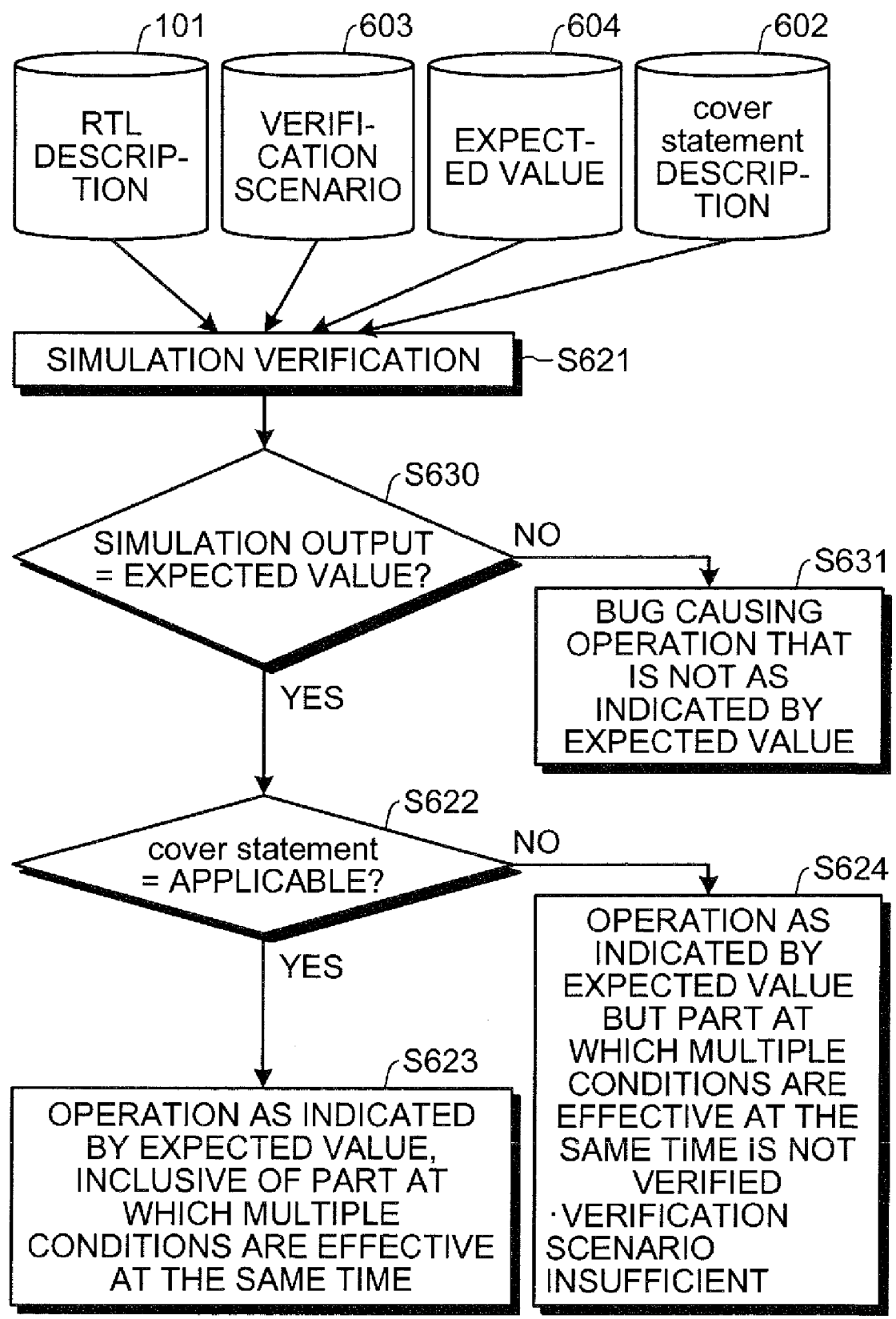
FIG. 20 is a schematic diagram of an example of simulation verification using the cover statement.
Figures 22, 23:
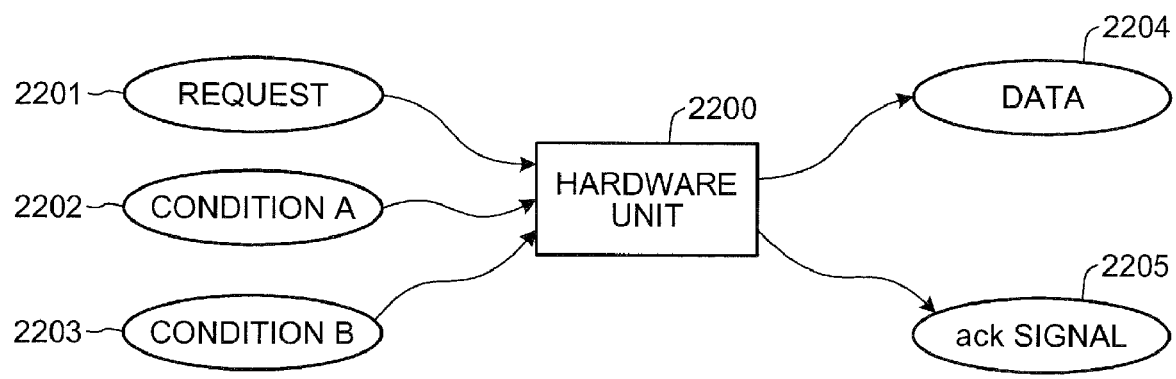
FIG. 22 is a schematic diagram for explaining input/output information of a hardware unit.
FIG. 23 is a chart of one example of hardware specifications.
Figure 24:
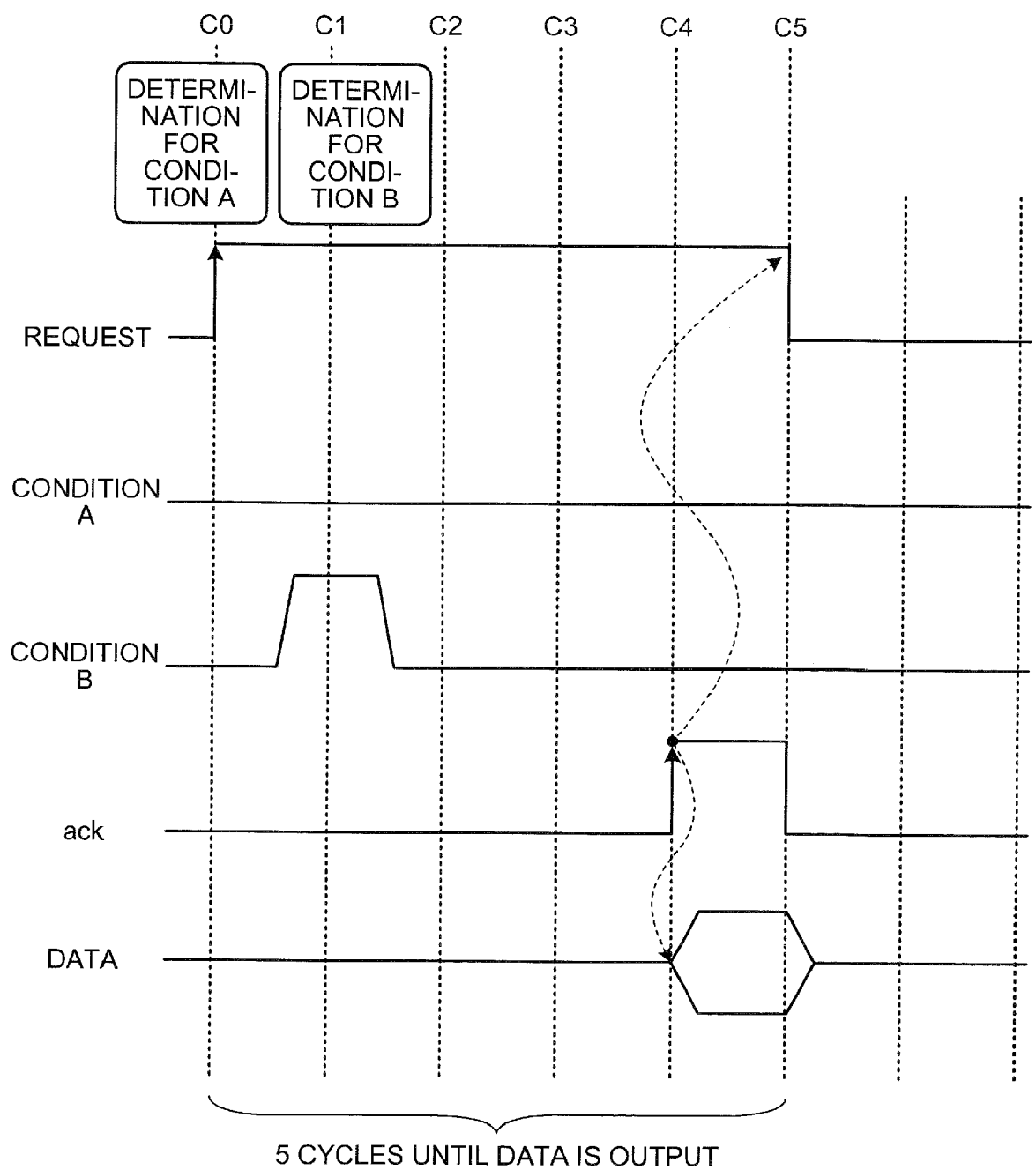
FIG. 24 is a timing chart of an example of operation corresponding to the specifications of hardware.
Figures 25, 26:
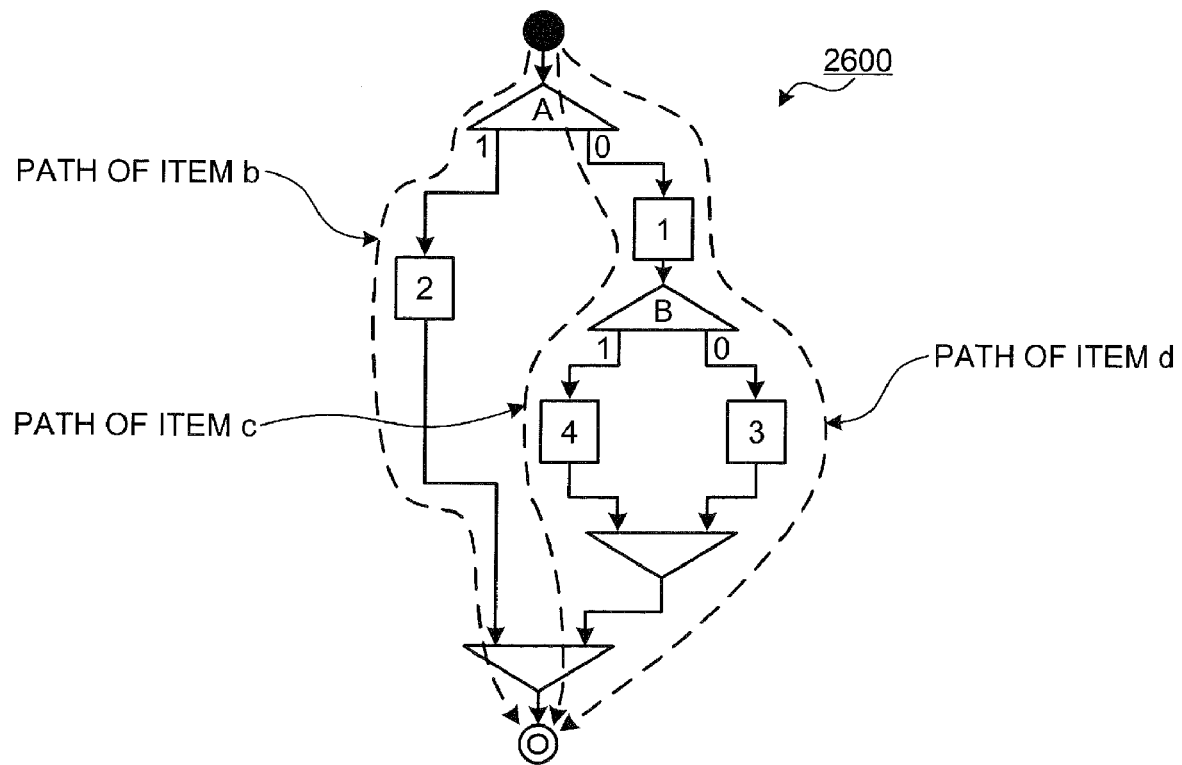
FIG. 25 is a chart of coverage of each verification scenario.
FIG. 26 is a schematic diagram for explaining one example of a CFG expressing a circuit to be verified.
Figures 27, 28:
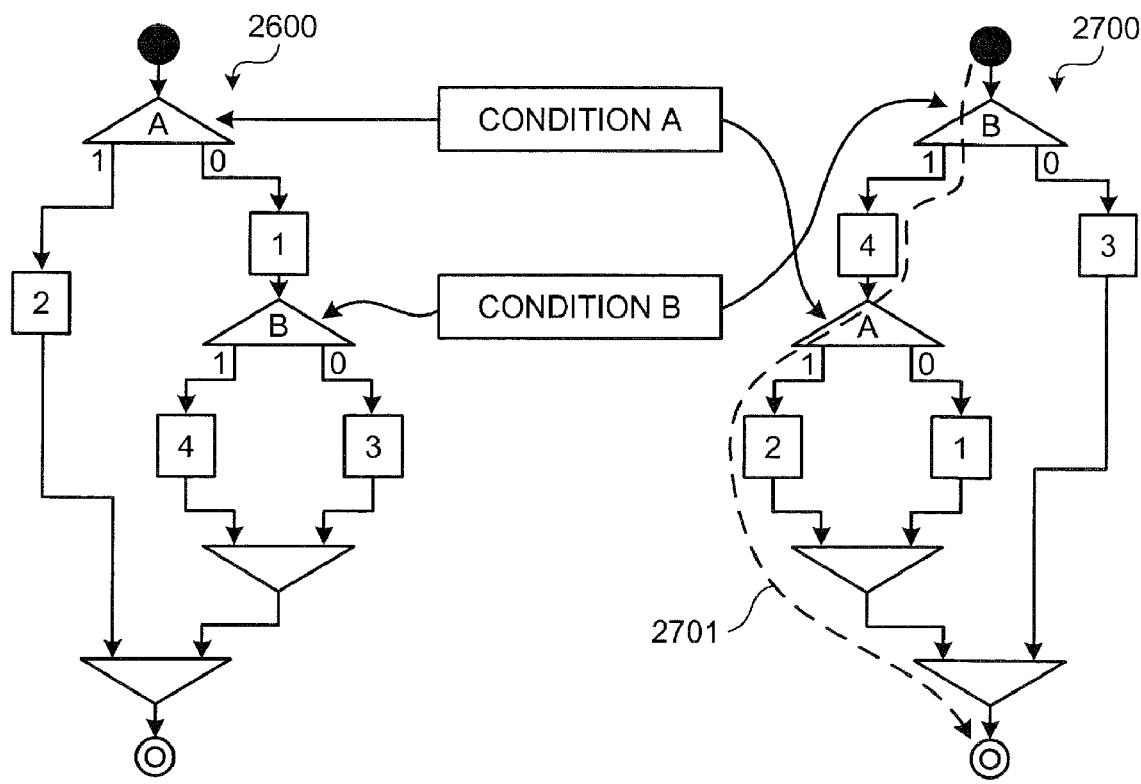
FIG. 27 is a schematic diagram for explaining an example in which an error in a conditional branch is overlooked.
FIG. 28 is a chart of the number of cycles corresponding to a conditional branch.

FIG. 20 is a schematic diagram of an example of simulation verification using the cover statement. When the assertion information 104 is created by the procedure explained with reference to FIG. 19, simulation verification is performed using the RTL description 101 of a circuit to be verified, the verification scenario 603, the expected value 604, the cover statement description 602 (cover{rose(req)condition B;req; (reqcondition A)} in this example) extracted from the assertion information 104 (step S621).

Although the simulation verification at step S621 is the same processing as the simulation verification explained in FIG. 6, determination of whether a simulation output is equal to the expected value 604 (step S630) may be added after the process at step S621. When the simulation output is determined to be equal to the expected value 604 at step S630 (step S630:YES), the process proceeds directly to step S622. When the simulation output is determined to be not equal to the expected value 604 (step S630: NO), it is determined that a bug in the RTL description 101 is the cause of operation that is not as indicated by the expected value 604 (step S631).

Because the processes at step S622 and after are explained in FIG. 6, the explanation therefor is omitted herein.

FIG. 21 is a chart of an output example of a simulation result. Based on an output example corresponding to a result of the simulation verification explained with reference to FIG. 20, determination is respectively made as depicted in a chart 2100. The inspector refers to this determination result to identify an omission in the verification scenario 603, and adds a verification scenario omitted in the verification scenario 603 thereto, thereby obtaining the verification coverage of truly 100.

As described, according to the present embodiment, assertion information to check whether a conditional branch specified by an inspector is created. Specifically, a combination of conditional branches in hierarchy is extracted from an input RTL description, and a simulation program to satisfy conditions that are specified by the extracted combination is created. Whether verification has been performed can be determined based on whether the conditions are satisfied in this simulation program. As a result, verification of a conditional branch that has been omitted in the conventional verification coverage can also be covered, and the verification accuracy for hardware design can be improved.

While the verification support apparatus 100 has such a configuration that the function of creating the assertion information and the function of performing the simulation verification using the created assertion information are both provided, the verification support apparatus 100 may be a device only having the function of creating the assertion information. The assertion information created by the verification support apparatus 100 may be applied for any use by other verification apparatuses.

The verification support method explained in the present embodiment can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be distributed through a network such as the Internet.

The verification support apparatus 100 described in the present embodiment can be realized by an application specific integrated circuit (ASIC) such as a standard cell or a structured ASIC, or a programmable logic device (PLD) such as a field-programmable gate array (FPGA). Specifically, for example, functional units (the receiving unit 501 to the deleting unit 507) of the verification support apparatus 100 are defined in hardware description language (HDL), which is logically synthesized and applied to the ASIC, the PLD, etc., thereby enabling manufacture of the verification support apparatus 100.

According to the embodiment, with respect to a combination of conditional branches included in hardware description of a sequential circuit to be verified, assertion information (simulation program) that realizes specified conditions and that satisfies a timing specification is output. Therefore, if the a condition having a possibility that verification has been omitted is specified and assertion information is output, by executing simulation verification using this assertion information, whether verification of the condition is covered can be checked based on a result of the simulation verification.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium stores therein a verification support program that causes a computer to execute:
    receiving a hardware description of a sequential circuit to be verified and a timing specification that indicates a timing constraint in the hardware description;
    converting the hardware description into a control flow graph that expresses a flow of control in the sequential circuit;
    identifying, from the control flow graph and as a combination of conditional branch descriptions having a hierarchical relation, conditional branch descriptions that are connected in parallel;
    extracting, from among combinations of conditional branch descriptions identified at the identifying, a combination having a potential to satisfy specified conditions;
    creating a simulation program that, at a timing satisfying the timing specification received at the receiving, causes the conditional branch descriptions included in the combination extracted at the extracting to satisfy the specified conditions; and
    outputting, as assertion information of the sequential circuit, the simulation program created at the creating.

2. The non-transitory computer-readable recording medium according to claim 1, the verification support program further causing the computer to execute deleting a specific combination of conditional branch descriptions designated in advance, from among combinations of conditional branch descriptions identified at the identifying, wherein
    the extracting includes extracting the combination, after the specific combination has been deleted at the deleting.

3. The non-transitory computer-readable recording medium according to claim 1, wherein
    the receiving includes receiving priority information indicating execution priority of the conditional branch descriptions relative to other conditional branches, and
    the identifying includes identifying the combination, based on the priority information.

4. The non-transitory computer-readable recording medium according to claim 1, wherein the creating includes creating the simulation program describing a cover statement that is written so as to satisfy the timing constraint in the timing specification and satisfies simultaneously the specified conditions for conditional branches described by the conditional branch descriptions included in the combination extracted at the extracting.

5. The non-transitory computer-readable recording medium according to claim 1, wherein
    the receiving includes receiving, as the timing specification, a constraint limiting the number of clocks for operation of the sequential circuit, and
    the creating includes creating the simulation program that satisfies the constraint.

6. The non-transitory computer-readable recording medium according to claim 1, the verification support program further causing the computer to execute verifying the sequential circuit based on whether an output value is equal to an expected value, the output value being obtained when a simulation program correlated with the combination is executed using the assertion information output at the outputting.

7. A verification support apparatus comprising:
a receiving unit that receives a hardware description of a sequential circuit to be verified and a timing specification that indicates a timing constraint in the hardware description;
a converting unit that converts the hardware description into a control flow graph that expresses a flow of control in the sequential circuit;
an identifying unit that identifies, from the control flow graph and as a combination of conditional branch descriptions having a hierarchical relation, conditional branch descriptions that are connected in parallel;
a combination extracting unit that, from among combinations of conditional branch descriptions identified by the identifying unit, extracts a combination having a potential to satisfy specified conditions;
a creating unit that creates a simulation program that, at a timing satisfying the timing specification received by the receiving unit, causes the conditional branch descriptions included in the combination extracted by the combination extracting unit to satisfy the specified conditions; and
an output unit that outputs, as assertion information of the sequential circuit, the simulation program created by the creating unit.

8. A verification support method comprising:
receiving a hardware description of a sequential circuit to be verified and a timing specification that indicates a timing constraint in the hardware description;
converting the hardware description into a control flow graph that expresses a flow of control in the sequential circuit;
identifying, from the control flow graph and as a combination of conditional branch descriptions having a hierarchical relation, conditional branch descriptions that are connected in parallel;
extracting, from among combinations of conditional branch descriptions identified at the identifying, a combination having a potential to satisfy specified conditions;
creating a simulation program using a computer that, at a timing satisfying the timing specification received at the receiving, causes the conditional branch descriptions included in the combination extracted at the extracting to satisfy the specified conditions; and
outputting, as assertion information of the sequential circuit, the simulation program created at the creating.

* * * * *